(12) United States Patent
Kayama et al.

(10) Patent No.: US 12,733,306 B2
(45) Date of Patent: Sep. 8, 2026

(54) LIGHT-EMITTING DEVICE AND SURFACE LIGHT SOURCE

(71) Applicant: NICHIA CORPORATION, Anan (JP)

(72) Inventors: Kiyoshi Kayama, Tokushima (JP); Takenori Kumakura, Anan (JP)

(73) Assignee: NICHIA CORPORATION, Anan (JP)

( * ) Notice: Subject to any disclaimer, the term of this patent is extended or adjusted under 35 U.S.C. 154(b) by 405 days.

(21) Appl. No.: 18/547,307

(22) PCT Filed: Feb. 25, 2022

(86) PCT No.: PCT/JP2022/008017
§ 371 (c)(1),
(2) Date: Aug. 21, 2023

(87) PCT Pub. No.: WO2022/196300
PCT Pub. Date: Sep. 22, 2022

(65) Prior Publication Data

US 2024/0136476 A1 Apr. 25, 2024
US 2024/0234643 A9 Jul. 11, 2024

(30) Foreign Application Priority Data

Mar. 15, 2021 (JP) ................................ 2021-041068
Nov. 10, 2021 (JP) ................................ 2021-183022

(51) Int. Cl.
*H10H 20/85* (2025.01)
*H10H 20/855* (2025.01)
*H10W 90/00* (2026.01)

(52) U.S. Cl.
CPC ...... *H10H 20/8506* (2025.01); *H10H 20/855* (2025.01); *H10W 90/00* (2026.01)

(58) Field of Classification Search
CPC ........... H10H 20/8506; H10H 20/0753; H10H 20/855; H10H 20/856; H10H 29/24;
(Continued)

(56) References Cited

U.S. PATENT DOCUMENTS

2005/0133808 A1* 6/2005 Uraya ................ H10H 20/8506 257/E33.072
2005/0243577 A1 11/2005 Moon
(Continued)

FOREIGN PATENT DOCUMENTS

CN 104633493 A 5/2015
CN 107644869 A 1/2018
(Continued)

OTHER PUBLICATIONS

International Search Report and Written Opinion of the International Searching Authority issued in the corresponding International Patent Application No. PCT/JP2022/008017, dated Apr. 19, 2022.

*Primary Examiner* — Monica D Harrison
*Assistant Examiner* — Jacob T Nelson
(74) *Attorney, Agent, or Firm* — Foley & Lardner LLP

(57) ABSTRACT

A light-emitting device includes a support including a wall portion; a light-emitting element placed on the support and surrounded by the wall portion in a plan view; a first light-transmissive member having a first outer surface and a second outer surface, which is located above the first outer surface and is located inside the first outer surface in the plan view, and covering the light-emitting element and the wall portion; and a light-shielding member covering the first light-transmissive member. The first outer surface and the second outer surface are exposed from the light-shielding member, and a surface roughness of the first outer surface is rougher than a surface roughness of the second outer surface.

17 Claims, 29 Drawing Sheets

(58) Field of Classification Search
CPC ............. H10H 29/8506; H10H 29/855; H10H 29/856; H10W 90/00
See application file for complete search history.

(56) References Cited

U.S. PATENT DOCUMENTS

| | | | | |
|---|---|---|---|---|
| 2011/0297999 | A1 | 12/2011 | Binder et al. | |
| 2014/0354145 | A1 | 12/2014 | Fisher et al. | |
| 2015/0129919 | A1* | 5/2015 | Liu | H10H 20/8506<br>257/98 |
| 2017/0084804 | A1* | 3/2017 | Chen | H10H 20/856 |
| 2018/0023784 | A1* | 1/2018 | Tamura | G02F 1/133608<br>362/235 |
| 2019/0006568 | A1* | 1/2019 | Hayashi | H10H 20/855 |
| 2020/0044121 | A1 | 2/2020 | Imada et al. | |
| 2020/0135991 | A1 | 4/2020 | Lin et al. | |
| 2020/0176648 | A1 | 6/2020 | Chen et al. | |
| 2020/0312823 | A1 | 10/2020 | Yamamoto et al. | |

FOREIGN PATENT DOCUMENTS

| | | | |
|---|---|---|---|
| CN | 109148674 | A | 1/2019 |
| JP | 2001-257381 | A | 9/2001 |
| JP | 2005-317977 | A | 11/2005 |
| JP | 2010-206039 | A | 9/2010 |
| JP | 2011-529628 | A | 12/2011 |
| JP | 2013-115280 | A | 6/2013 |
| JP | 2014-007145 | A | 1/2014 |
| JP | 2019-050209 | A | 3/2019 |
| KR | 10-2020-0068610 | A | 6/2020 |

* cited by examiner

LIGHT-EMITTING DEVICE AND SURFACE LIGHT SOURCE

TECHNICAL FIELD

The present invention relates to a light-emitting device and a planar light source.

BACKGROUND ART

PTL 1 discloses a light-emitting device in which a reflective resin is provided on an upper surface of a transparent resin that seals a light-emitting element and light from the light-emitting element is emitted to the outside from a lateral surface of the transparent resin. Such a light-emitting device easily spreads light in a lateral direction and can be used as, for example, a light source for backlight or the like.

CITATION LIST

Patent Literature

PTL 1: JP 2013-115280 A

SUMMARY OF INVENTION

Technical Problem

A light-emitting device that can more efficiently spread light from a light-emitting element in a lateral direction is desired. An embodiment according to the present invention provides a light-emitting device that can efficiently spread light from a light-emitting element in a lateral direction.

Solution to Problem

A light-emitting device of an embodiment includes a support including a wall portion; a light-emitting element placed on the support and surrounded by the wall portion in a plan view; a first light-transmissive member having a first outer surface and a second outer surface and covering the light-emitting element and the wall portion, the second outer surface located above the first outer surface and located inside the first outer surface in the plan view; and a light-shielding member covering the first light-transmissive member. The first outer surface and the second outer surface are exposed from the light-shielding member, and a surface roughness of the first outer surface is rougher than a surface roughness of the second outer surface.

Advantageous Effects of Invention

A light-emitting device of an embodiment of the present invention can efficiently spread light from a light-emitting element in a lateral direction.

DESCRIPTION OF EMBODIMENTS

Figure 1:
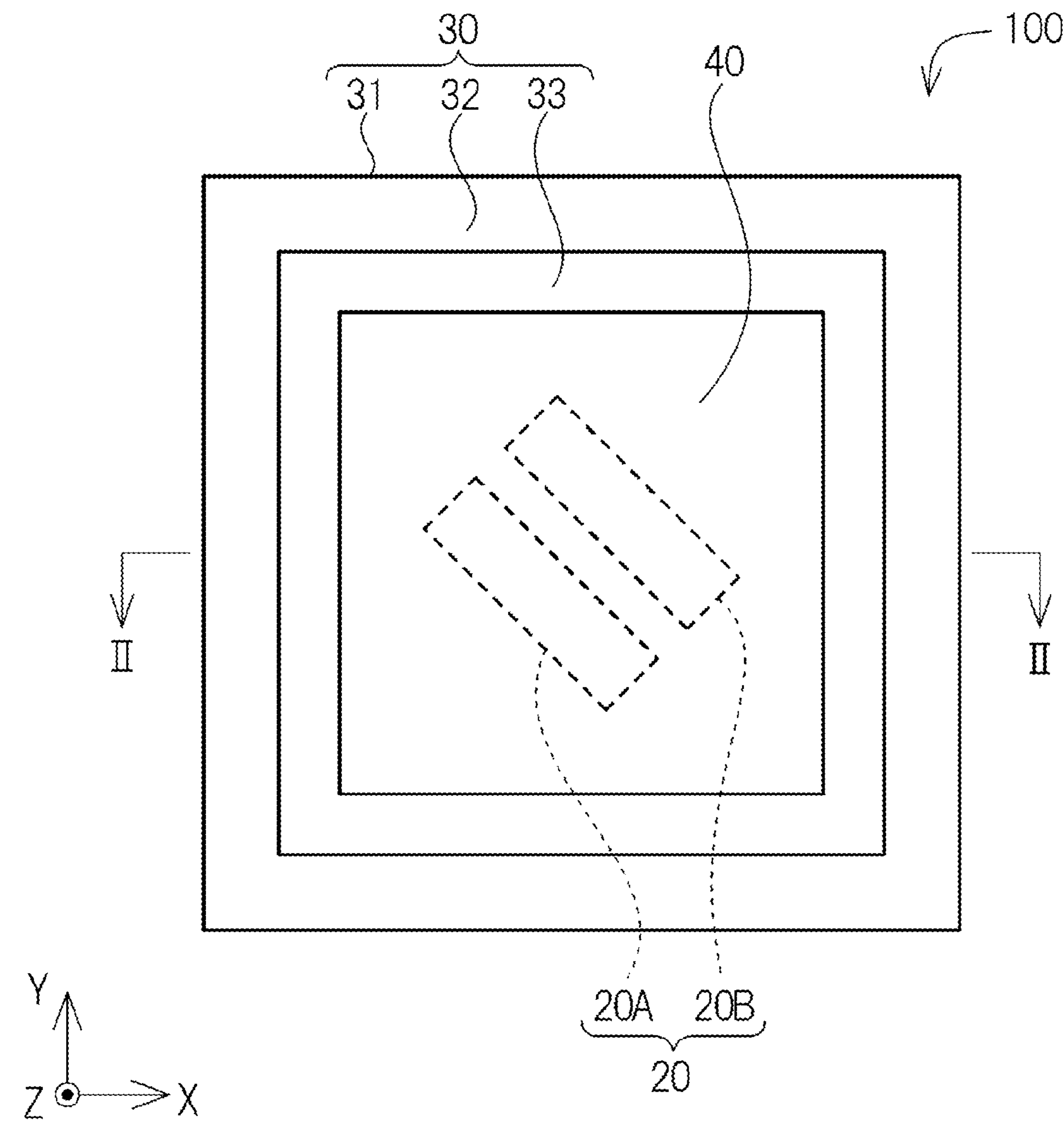
FIG. 1 is a schematic plan view illustrating a light-emitting device according to an embodiment of the present disclosure.

Embodiments of the present invention are described below with reference to the drawings. Each of the drawings schematically illustrates an embodiment of the present invention. Thus, a scale, an interval, a positional relationship, or the like of each member may be exaggerated, or illustration of a part of the member may be omitted. Hereinafter, end views may be illustrated as cross-sectional views. In the drawings, the same constituent elements are denoted by the same reference characters.

In the following description, components having substantially the same function may be denoted by common reference characters and a description thereof may be omitted.

Hereinafter, terms indicating a specific direction or position (for example, "upper," "lower," and other terms including those terms) may be used. However, these terms are used merely to make it easy to understand relative directions or positions in the referenced drawing. As long as the relative directional or positional relationship is the same as that described in the referenced drawing using the term such as "upper" or "lower," in drawings other than the drawings of the present disclosure, actual products, and the like, components need not be arranged in the same manner as that in the referenced drawing. In the present description, "parallel" includes not only a case in which two straight lines, sides, surfaces, or the like do not intersect even if extended, but also a case in which an angle formed by the two straight lines, sides, surfaces, or the like is in a range of 5° or less unless otherwise specified. In the present description, a positional relationship expressed as "above" includes both a case in which components are in contact with each other and a case in which components are not in contact with each other but one component is located above the other component.

Embodiment

A light-emitting device 100 according to the present embodiment is described with reference to FIGS. 1 to 3, FIGS. 4A and 4B, FIGS. 5 and 6, FIGS. 7A to 7C, and FIG. 8. For reference, FIGS. 1 to 3, FIGS. 4A and 4B, FIGS. 5 and 6, FIGS. 7A to 7C, and FIG. 8 illustrate arrows respectively indicating an X direction, a Y direction, and a Z direction, which are orthogonal to one another. In the schematic cross-sectional view illustrated in FIG. 2, a lateral direction is assumed to be the X direction and/or the Y direction, and an up and down direction is assumed to be the Z direction.

The light-emitting device 100 includes a support 10, a light-emitting element 20, a first light-transmissive member 30, and a light-shielding member 40. The light-emitting device 100 may further include a second light-transmissive member 50 and a wire 60. The support 10 includes a wall portion 12. The light-emitting element 20 is placed on the support 10. In the plan view, the light-emitting element 20 is surrounded by the wall portion 12. The first light-transmissive member 30 covers the light-emitting element 20 and the wall portion 12. The first light-transmissive member 30 has a first outer surface 31 and a second outer surface 32. The second outer surface 32 is located above the first outer surface 31. In the plan view, the second outer surface 32 is located inside the first outer surface 31. The light-shielding member 40 covers the first light-transmissive member 30. The first outer surface 31 is exposed from the light-shielding member 40. The second outer surface 32 is exposed from the light-shielding member 40. The surface roughness of the first outer surface 31 is rougher than the surface roughness of the second outer surface 32.

The first outer surface 31 is located below the second outer surface 32 and is located outside the second outer surface 32 in the plan view. Accordingly, the first outer surface 31 is more likely to receive light emitted from the light-emitting element 20 and having a large component in the lateral direction (the X direction and/or the Y direction) than the second outer surface 32. In the present description, light having a large component in the lateral direction (the X direction and/or the Y direction) means that when light emitted from the light-emitting element is divided into a component traveling in the up and down direction (the Z direction) and a component traveling in the lateral direction (the X direction and/or the Y direction), the ratio of the component traveling in the lateral direction (the X direction and/or the Y direction) to the component traveling in the up and down direction (the Z direction) is high. The second outer surface 32 is more likely to receive light emitted from the light-emitting element and having a large component in the up and down direction (the Z direction) than the first outer surface 31. The light emitted from the light-emitting element also includes light reflected by an outer surface of the first light-transmissive member 30 or the like. Because the surface of the first outer surface 31 is rougher than the surface of the second outer surface 32, the surface area of the first outer surface 31 can be made larger than when the surface of the first outer surface 31 is not rough. This makes it easier to extract light from the light-emitting element 20 from the first outer surface 31 to the outside of the light-emitting device 100. The light-emitting device 100 can efficiently spread the light from the light-emitting element 20 in the lateral direction because the light from the light-emitting element 20 is easily extracted to the outside of the light-emitting device by the first outer surface 31 that easily receives the light emitted from the light-emitting element 20 and having a large component in the lateral direction.

In the light-emitting device 100, the light-shielding member 40 covers an upper surface of the light-emitting element 20 via the first light-transmissive member 30. Accordingly, a part of light traveling upward from the light-emitting element 20 is shielded by the light-shielding member 40. Thus, light emitted from the light-emitting device 100 tends to be light having a large component in the lateral direction (the X direction and/or the Y direction). Each of the components constituting the light-emitting device 100 is described below.

Support 10

Figure 3:
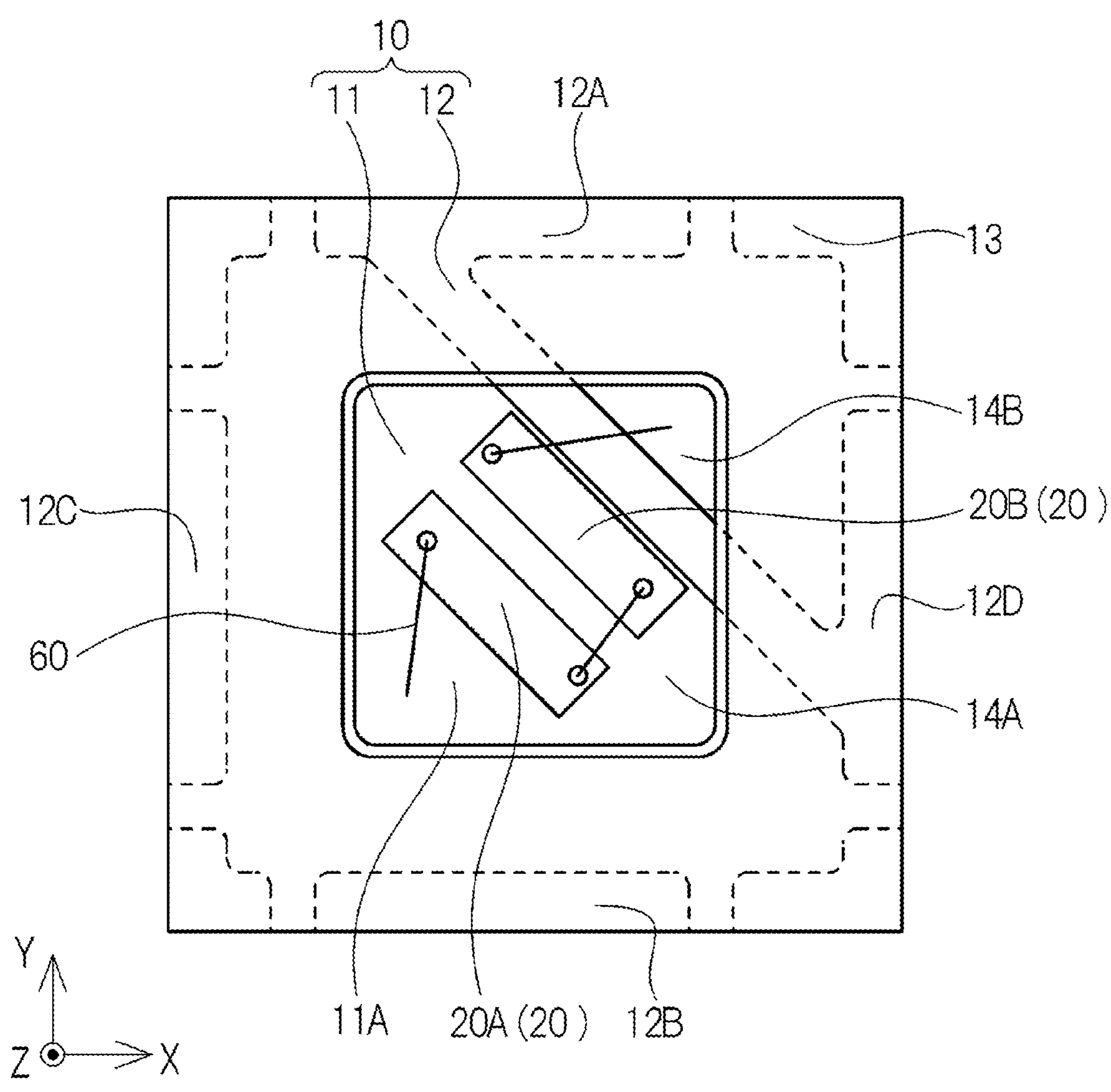
FIG. 3 is a schematic plan view in which a first light-transmissive member, a second light-transmissive member, and a light-shielding member are omitted from the light-emitting device illustrated in FIG. 1.

The support 10 is a member on which the light-emitting element 20 is placed. As illustrated in FIG. 3, the support 10 includes a base portion 11 and a wall portion 12. The base portion 11 has a placement surface 11A on which the light-emitting element 20 is placed. The placement surface 11A is located on an upper surface of the base portion 11. In the plan view, the wall portion 12 surrounds the placement surface 11A. In the plan view, the wall portion 12 surrounds the light-emitting element 20. The wall portion 12 is located above the base portion 11. The wall portion 12 illustrated in FIG. 3 includes a first wall portion 12A, a second wall portion 12B, a third wall portion 12C, and a fourth wall portion 12D. The first wall portion 12A extends in the X direction. The second wall portion 12B faces the first wall portion 12A and extends in the X direction. The third wall portion 12C is located between the first wall portion 12A and the second wall portion 12B and extends in the Y direction. The fourth wall portion 12D is located between the first wall portion 12A and the second wall portion 12B, faces the third wall portion 12C, and extends in the Y direction.

Figure 2:
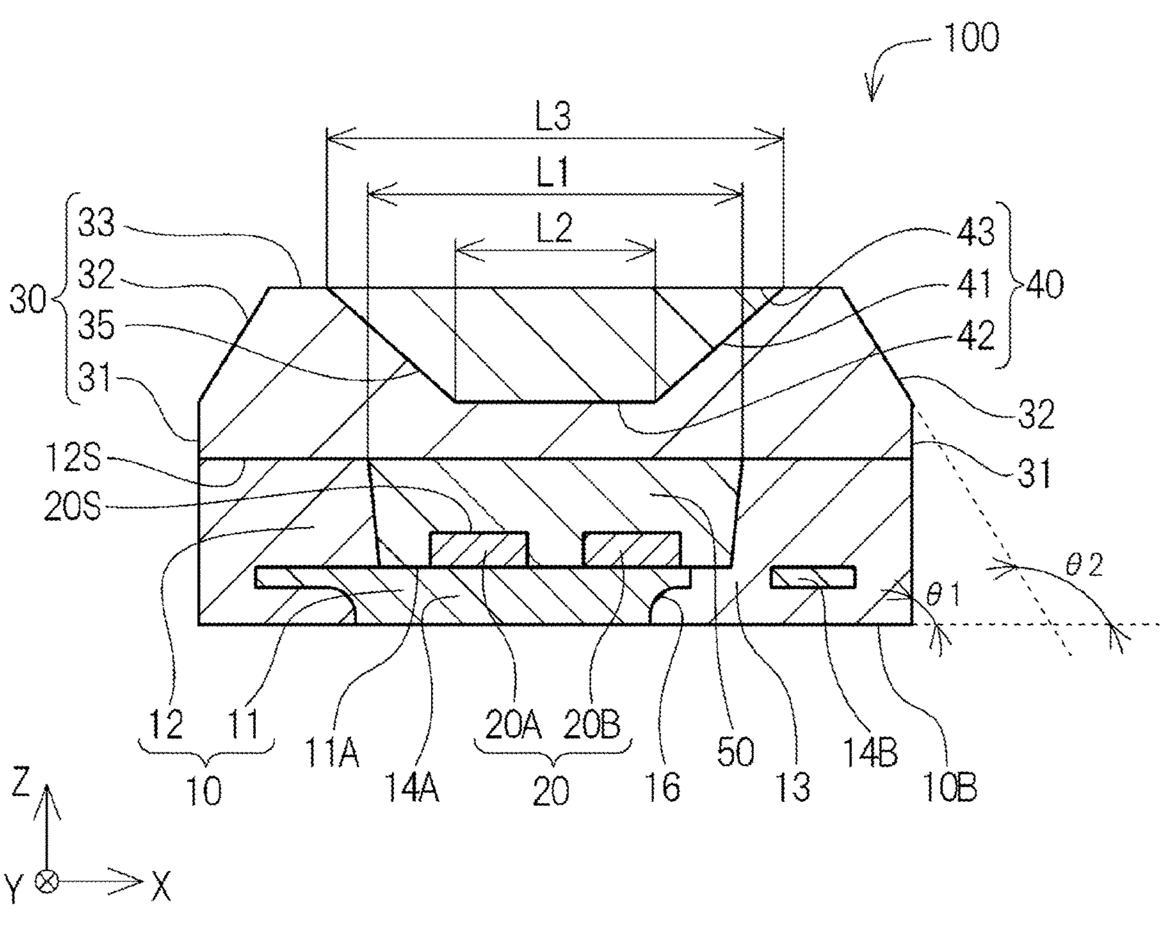
FIG. 2 is a schematic cross-sectional view taken along line II-II illustrated in FIG. 1.

As illustrated in FIGS. 2 and 3, the support 10 may include a resin member 13, a first lead 14A, and a second lead 14B. The resin member 13 is a member located between the first lead 14A and the second lead 14B to hold the first lead 14A and the second lead 14B. The wall portion 12 may be formed by the resin member 13. When the wall portion 12 is formed by the resin member 13, it can be said that the wall portion 12 is a portion of the resin member 13 located above upper surfaces of the first lead 14A and the second lead 14B. The base portion 11 may be formed by a part of the resin member 13, the first lead 14A, and the second lead 14B. The support 10 may include three or more leads.

As a material of the resin member 13, a known material such as a thermosetting resin or a thermoplastic resin can be used. Examples of the thermoplastic resin that can be used include a polyphthalamide resin, a polybutylene terephthalate (PBT), and an unsaturated polyester. Examples of the thermosetting resin that can be used include an epoxy resin, a modified epoxy resin, a silicone resin, and a modified silicone resin. A thermosetting resin such as an epoxy resin or a silicone resin, which has good heat resistance and light resistance properties, is preferably used as the material of the resin member 13.

The material of the resin member 13 preferably contains a light reflective material. As the light reflective material, it is preferable to use a material that hardly absorbs light from the light-emitting element 20 and has a large difference in refractive index with respect to a resin material. Examples of such a light reflective material include titanium oxide, zinc oxide, silicon oxide, zirconium oxide, aluminum oxide, and aluminum nitride. The light reflective material can be contained in a range from 10 wt. % to 90 wt. % with respect to a resin material, for example.

Each of the first lead 14A and the second lead 14B is a member that is electrically connected to either a negative electrode or a positive electrode of a pair of electrodes of the light-emitting element 20 to energize the light-emitting element 20. The first lead 14A and the second lead 14B, for example, can be formed into a predetermined shape by processing such as rolling, punching, extrusion, etching such as wet or dry etching, or a combination thereof by using metal such as copper, aluminum, gold, silver, iron, nickel, or an alloy thereof, phosphor bronze, or iron-containing copper. The first lead 14A and the second lead 14B may be a single layer or may have a layered structure. It is particularly preferable to use copper, which is inexpensive and has high heat dissipation properties, as the material of the first lead 14A and the second lead 14B. In order to improve reflectance, the first lead 14A and the second lead 14B may be partly or entirely plated with metal such as silver, aluminum, copper, or gold in a single-layer structure or a layered structure. When a silver-containing metal layer is formed on the outermost surfaces of the first lead 14A and the second lead 14B, a protective layer such as silicon oxide is preferably provided on the surface of the silver-containing metal layer. This can suppress discoloration of the silver-containing metal layer due to sulfur components in the air. Examples of a method for forming the protective layer include a known method such as vacuum processing, namely, sputtering or the like.

Figure 4A:
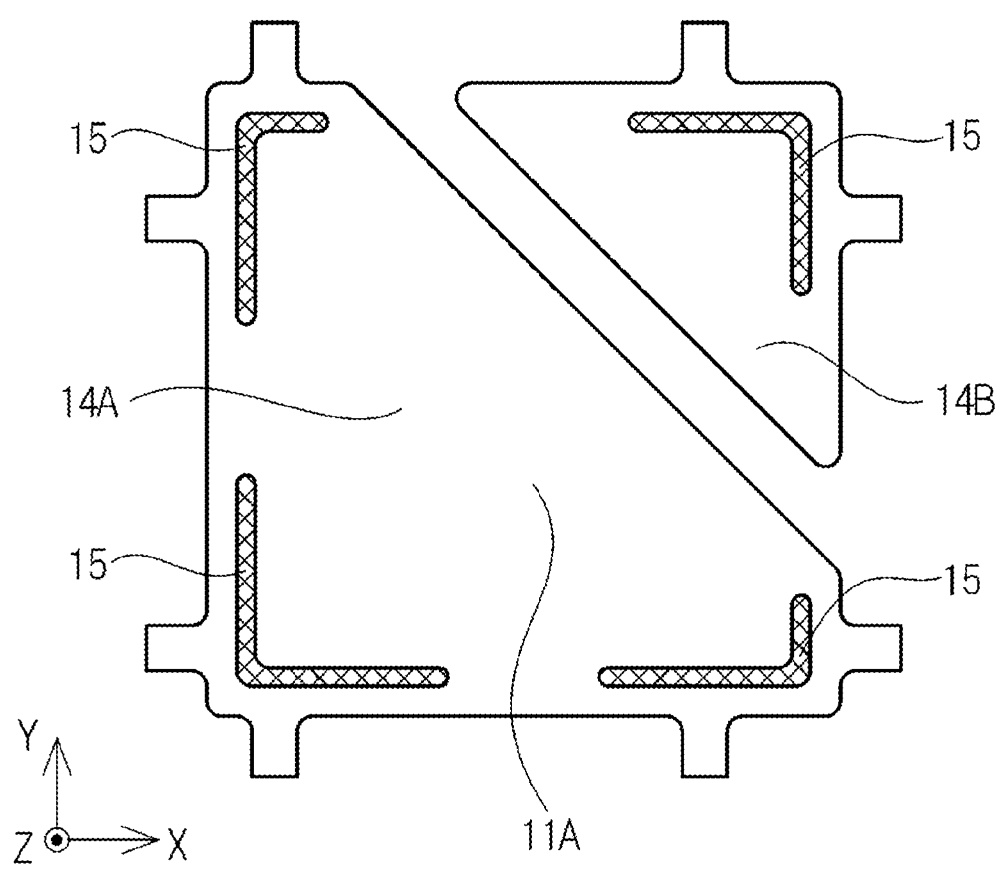
FIG. 4A is a schematic plan view illustrating a first lead and a second lead according to the present embodiment.

As illustrated in FIG. 2, the first lead 14A and the second lead 14B are preferably exposed from the resin member 13 on a lower surface of the light-emitting device 100. By so doing, heat from the light-emitting device 100 is easily transferred to a mounting substrate, on which the light-emitting device 100 is mounted, via the first lead 14A and the second lead 14B. Thus, heat dissipation properties of the light-emitting device 100 can be improved. As illustrated in FIG. 4A, first grooves 15 (indicated by hatching) are preferably formed in the upper surface of the first lead 14A and/or the second lead 14B. The first groove 15 is recessed downward from the upper surface of the first lead 14A and/or the second lead 14B. The first groove 15 can be formed by etching, pressing, or the like. The first groove 15 is disposed around the placement surface 11A in the plan view. A part of the resin member 13 is disposed in the first groove 15. This improves adhesion between the resin member 13 and the first lead 14A and/or the second lead 14B.

Figure 4B:
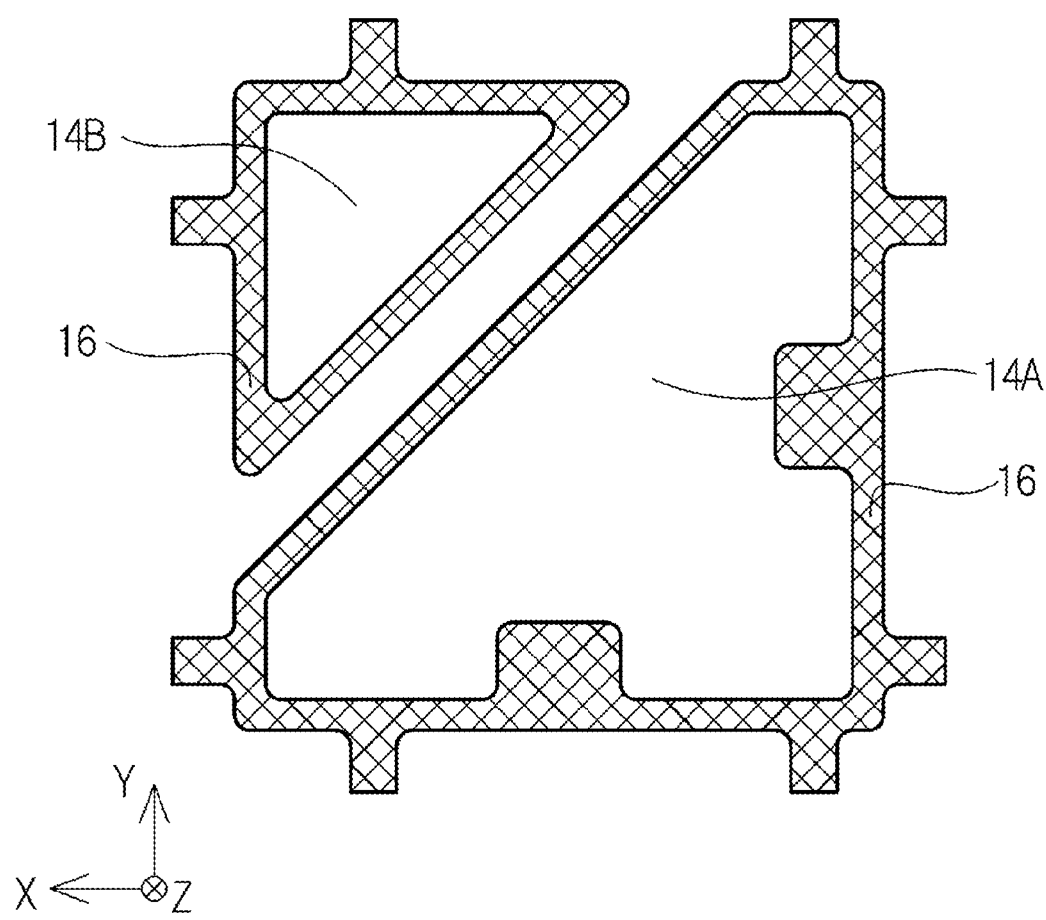
FIG. 4B is a schematic bottom view illustrating the first lead and the second lead according to the present embodiment.

As illustrated in FIG. 4B, second grooves 16 (indicated by hatching) are preferably formed in a lower surface of the first lead 14A and/or the second lead 14B. The second groove 16 is recessed upward from the lower surface of the first lead 14A and/or the second lead 14B. The second groove 16 can be formed by etching, pressing, or the like. The second groove 16 is disposed along an outer edge of the first lead 14A and/or the second lead 14B. Another part of the resin member 13 is disposed in the second groove 16. This improves the adhesion between the resin member 13 and the first lead 14A and/or the second lead 14B.

Light-Emitting Element 20

The light-emitting element 20 is a semiconductor element that emits light by itself when a voltage is applied thereto, and a known semiconductor element made of a nitride semiconductor or the like can be applied to the light-emitting element 20. Examples of the light-emitting element 20 include an LED chip. The light-emitting element 20 includes a semiconductor layered body. The semiconductor layered body includes an n-type semiconductor layer, a p-type semiconductor layer, and a light-emitting layer interposed therebetween. The light-emitting layer may have a structure such as a double heterojunction or a single quantum well (SQW) or may have a structure with a group of active layers such as a multiple quantum well (MQW). The semiconductor layered body is configured to be able to emit visible light or ultraviolet light. The semiconductor layered body including such a light-emitting layer can include $In_xAl_yGa_{1-x-y}N$ ($0 \le x$, $0 \le y$, and $x+y \le 1$), for example. The semiconductor layered body may have a structure including one or more light-emitting layers between the n-type semiconductor layer and the p-type semiconductor layer or may have a structure in which a structure sequentially including the n-type semiconductor layer, the light-emitting layer, and the p-type semiconductor layer is repeated a plurality of times. When the semiconductor layered body includes a plurality of light-emitting layers, the plurality of light-emitting layers may include light-emitting layers having different emission peak wavelengths or light-emitting layers having the same emission peak wavelength. The same emission peak wavelength also includes a case in which there is a variation within ±10 nm. A combination of emission peak wavelengths between the plurality of light-emitting layers can be selected as appropriate. For example, when the semiconductor layered body includes two light-emitting layers, light-emitting layers can be selected in combinations of blue light and blue light, green light and green light, red light and red light, ultraviolet light and ultraviolet light, blue light and green light, blue light and red light, or green light and red light. Each of the light-emitting layers may include a plurality of active layers having different emission peak wavelengths or may include a plurality of active layers having the same emission peak wavelength.

In one light-emitting device, only one light-emitting element 20 may be placed, or a plurality of light-emitting elements 20 may be placed. When one light-emitting device includes a plurality of light-emitting elements 20, a plurality of light-emitting elements having the same emission peak wavelength may be combined in order to improve the luminous intensity of the entire light-emitting device. For example, in order to improve color reproductivity, a plurality of light-emitting elements having different emission peak wavelengths may be combined to correspond to a red color, a green color, and a blue color. When the light-emitting device includes a plurality of light-emitting elements, all the light-emitting elements may be connected in series, may be connected in parallel, or may be connected using a combination of series connection and parallel connection. The light-emitting element 20 may be mounted in a face-up manner in which the surface on which the electrodes are formed facing upward or mounted in a flip-chip manner in which the surface on which the electrodes are formed facing downward. The light-emitting element 20 of the light-emitting device 100 is mounted in the face-up manner, and electrical connection is implemented via the wire 60.

One side of the rectangular shape of the light-emitting element 20 in the plan view may be parallel to the X direction or the Y direction, or the light-emitting element 20 may be placed on the placement surface 11A such that one side of the rectangular shape is inclined with respect to the X direction and the Y direction as illustrated in FIG. 3. By placing the light-emitting elements 20 on the placement surface 11A such that one side of the rectangular shape of the light-emitting elements 20 is inclined with respect to the X direction and the Y direction in the plan view, the light distribution characteristics of the light-emitting device 100 can be changed as compared with a case in which one side of the rectangular shape is parallel to the X direction or the Y direction. For example, one side of the rectangular shape of the light-emitting element 20 in the plan view may be inclined at an angle in a range from 35° to 60° with respect to the X direction.

Figure 5:
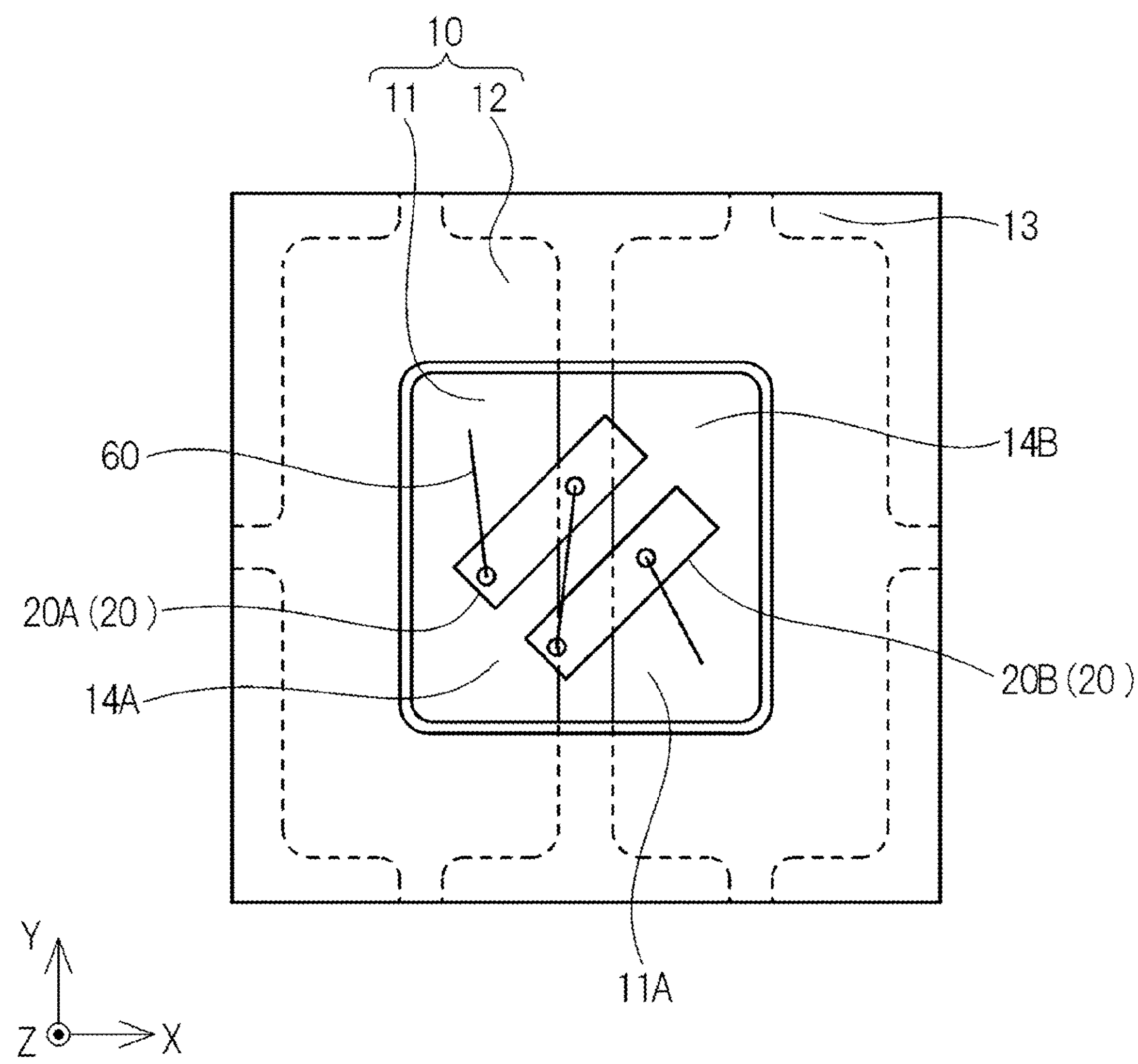
FIG. 5 is a schematic plan view in which a first light-transmissive member, a second light-transmissive member, and a light-shielding member are omitted from a variation of the light-emitting device according to the present embodiment.

As illustrated in FIG. 3, the light-emitting device 100 may include two or more light-emitting elements 20 each having a rectangular shape. The two light-emitting elements 20 may be referred to as a first light-emitting element 20A and a second light-emitting element 20B. A short side of the first light-emitting element 20A and a short side of the second light-emitting element 20B may face each other, or a long side of the first light-emitting element 20A and a long side of the second light-emitting element 20B may face each other as illustrated in FIG. 3. Preferably, one side of the first light-emitting element 20A and one side of the second light-emitting element 20B, which face each other, are parallel to each other. This makes it easier to reduce the light-emitting device 100 in size in the X direction and/or the Y direction. As illustrated in FIG. 5, the light-emitting element 20 may overlap the resin member 13 in the plan view, or as illustrated in FIG. 3, the light-emitting element 20 may not overlap the resin member 13 in the plan view. As illustrated in FIG. 3, all the light-emitting elements 20 preferably overlap the first lead 14A in the plan view. The first lead 14A typically conducts heat more easily than the resin member 13. Thus, when all the light-emitting elements 20 overlap the first lead 14A in the plan view, heat of each of the light-emitting elements 20 is easily transferred to the first lead 14A, so that the heat dissipation properties of the light-emitting device 100 are improved. Even though all the light-emitting elements 20 overlap the second lead 14B, instead of the first lead 14A, in the plan view, the heat dissipation properties of the light-emitting device 100 are improved, which is preferable. When the light-emitting device 100 includes one light-emitting element 20, the light-emitting element 20 may overlap the first lead 14A or the second lead 14B as a whole in the plan view, or the light-emitting element 20 may partially overlap the first lead 14A and/or the second lead 14B in the plan view.

First Light-Transmissive Member 30

The first light-transmissive member 30 is a member having translucency to light from the light-emitting element 20. The first light-transmissive member 30 covers the light-emitting element 20 and the wall portion 12 of the support 10. Thus, light from the light-emitting element 20 can be extracted to the outside of the light-emitting device 100 via the first light-transmissive member 30. As illustrated in FIG. 2, the first light-transmissive member 30 covers an upper surface 20S of the light-emitting element 20 and an upper surface 12S of the wall portion 12. The first light-transmissive member 30 may cover the upper surface 20S of the light-emitting element 20 via the second light-transmissive member 50 or may cover the light-emitting element 20 in contact with the upper surface 20S of the light-emitting element 20. In the present description, having translucency means that the transmittance for the peak wavelength of a light-emitting element is 50% or more. When the light-emitting device includes a plurality of light-emitting elements, the transmittance for the peak wavelength of at least one light-emitting element may be 50% or more.

The first light-transmissive member 30 has the first outer surface 31 and the second outer surface 32. The second outer surface 32 is located above the first outer surface 31 and is located inside the first outer surface in the plan view. In other words, the first outer surface 31 is located below the second outer surface 32 and is located outside the second outer surface in the plan view. Because the first outer surface 31 is located below the second outer surface 32 and is located outside the first outer surface in the plan view, the light having a large component in the lateral direction emitted from the light emitting element 20 is more likely to be received on the first outer surface 31 than the second outer surface 32. The value of the surface roughness of the first outer surface 31 is greater than the value of the surface roughness of the second outer surface 32. Accordingly, the light from the light-emitting element 20 is more easily extracted to the outside of the light-emitting device 100 by the first outer surface 31 than by the second outer surface 32. Thus, the light from the light-emitting element 20 is easily extracted to the outside from the first outer surface 31, which is likely to receive light having a large component in the lateral direction, so that the light-emitting device 100 can efficiently spread the light from the light-emitting element 20 in the lateral direction. In the plan view, the first outer surface 31 and the second outer surface 32 preferably surround the light-emitting element 20. By so doing, the light from the light-emitting element 20 can be more efficiently spread in the lateral direction. Because the second outer surface 32 is smoother than the first outer surface 31, the second outer surface 32 is more difficult to extract the light from the light-emitting element 20 than the first outer surface 31. Thus, the light distribution characteristics of the light-emitting device 100 are easily controlled by changing the shape of the second outer surface 32.

In the present description, the surface roughness of the first outer face 31 and the surface roughness of the second outer face 32 refer to an arithmetic average roughness Ra defined by JIS standard B0601:2013. The arithmetic average roughness Ra can be measured by using a laser microscope, a contact surface roughness measuring machine, or the like. The value of the arithmetic average roughness Ra described in the present description is a value obtained by measurement using, for example, a laser microscope VK-X3000 (lens magnification of 50 times) manufactured by Keyence Corporation.

A specific value of the arithmetic average roughness of the first outer surface 31 is not particularly limited but is preferably in a range from 1.2 times to 5.0 times the arithmetic average roughness of the second outer surface 32. When the arithmetic average roughness of the first outer surface 31 is 1.2 times or more the arithmetic average roughness of the second outer surface 32, light from the light-emitting element 20 is easily extracted from the first outer surface 31 to the outside. When the arithmetic average roughness of the first outer surface 31 is 5.0 times or less the arithmetic average roughness of the second outer surface 32, chipping of a part of the first outer surface 31 is easily suppressed. The arithmetic average roughness of the first outer surface 31 is preferably in a range from 100 nm to 500 nm. When the arithmetic average roughness of the first outer surface 31 is 100 nm or more, light from the light-emitting elements 20 is easily extracted from the first outer surface 31 to the outside. When the arithmetic average roughness of the first outer surface 31 is 500 nm or less, chipping of a part of the first outer surface 31 is easily suppressed. The arithmetic average roughness of the second outer surface 32 is preferably in a range from 50 nm to 200 nm. When the arithmetic average roughness of the second outer surface 32 is 50 nm or more, light from the light-emitting elements 20 is easily extracted from the second outer surface 32 to the outside. When the arithmetic average roughness of the second outer surface 32 is 200 nm or less, chipping of a part of the second outer surface 32 is easily suppressed. When the arithmetic average roughness of the second outer surface 32 is 200 nm or less, the light distribution characteristics of the light-emitting device 100 are easily controlled by the shape of the second outer surface 32.

As illustrated in FIG. 2, in the cross-sectional view, a first angle θ1 formed by the first outer surface 31 and a lower surface 10B of the support 10 is preferably less than a second angle θ2 formed by the second outer surface 32 and the lower surface 10B of the support 10. Because this makes it difficult for the first outer surface 31 to receive an upward component of light emitted from the light-emitting element 20, light extracted from the first outer surface 31 to the outside of the light-emitting device 100 is likely to have a large component in the lateral direction. In the present description, the first angle θ1 is an angle formed by a plane including the first outer surface 31 and a plane including the lower surface 10B of the support 10. As illustrated in FIG. 2, the first angle θ1 is an angle defined by a point at which the plane including the first outer surface 31 and the plane including the lower surface 10B of the support 10 intersect with each other and refers to an angle located farther from the center of the light-emitting device among angles located above the lower surface 10B of the support 10. Similarly, in the present description, the second angle θ2 is an angle formed by a plane including the second outer surface 32 and the plane including the lower surface 10B of the support 10. As illustrated in FIG. 2, the second angle θ2 is an angle defined by a point at which the plane including the second outer surface 32 and the plane including the lower surface 10B of the support 10 intersect with each other and refers to an angle located farther from the center of the light-emitting device among the angles located above the lower surface 10B of the support 10. The second outer surface 32 is inclined in a direction away from the center of the light-emitting device toward the lower surface 10B of the support 10. The lower surface 10B of the support 10 illustrated in FIG. 2 extends in the lateral direction (the X direction).

The first light-transmissive member 30 illustrated in FIG. 2 has four-fold rotational symmetry with respect to the Z direction, but is not limited thereto. For example, the first light-transmissive member 30 may or may not be symmetrical with respect to a YZ plane passing through the center of the light-emitting device. In the cross-sectional view illustrated in FIG. 2, the magnitude of a second angle formed by the second outer surface 32 located to the left of the center (YZ plane) of the light-emitting device and the lower surface 10B of the support 10 may be different from the magnitude of a second angle formed by the second outer surface 32 located to the right of the center (YZ plane) of the light-emitting device and the lower surface 10B of the support 10.

A specific value of the first angle θ1 is not particularly limited, but is preferably in a range from 85° to 95°. When the first angle θ1 is in a range from 85° to 95°, the first outer surface 31 is less likely to receive the upward component of the light emitted from the light-emitting element 20. Thus, light emitted from the light-emitting device 100 is likely to have a large component in the lateral direction. A specific value of the second angle θ2 is not particularly limited, but is preferably in a range from 100° to 150°. When the second angle θ2 is 100° or more, the second outer surface 32 easily receives the light from the light-emitting element 20. This improves the light extraction efficiency of the light-emitting device 100. When the second angle θ2 is 150° or less, the second outer surface 32 easily receives the light emitted from the light-emitting element 20 and having a large component in the lateral direction. Thus, light emitted from the light-emitting device 100 is likely to have a large component in the lateral direction.

As illustrated in FIG. 2, the first outer surface 31 and an outer surface of the wall portion 12 are preferably flush with each other. This makes it easier to reduce the light-emitting device in size in the lateral direction. The structure illustrated in FIG. 6 may be cut along a broken line C1 and a broken line C2 in FIG. 6 to form the first outer surface 31 and the outer surface of the wall portion 12 (see FIG. 2). By so doing, the first outer surface 31 and the outer surface of the wall portion 12 can be easily made flush with each other. A known method can be applied to the cutting method. For example, cutting by using a blade or cutting by using laser light may be used.

Figure 6:
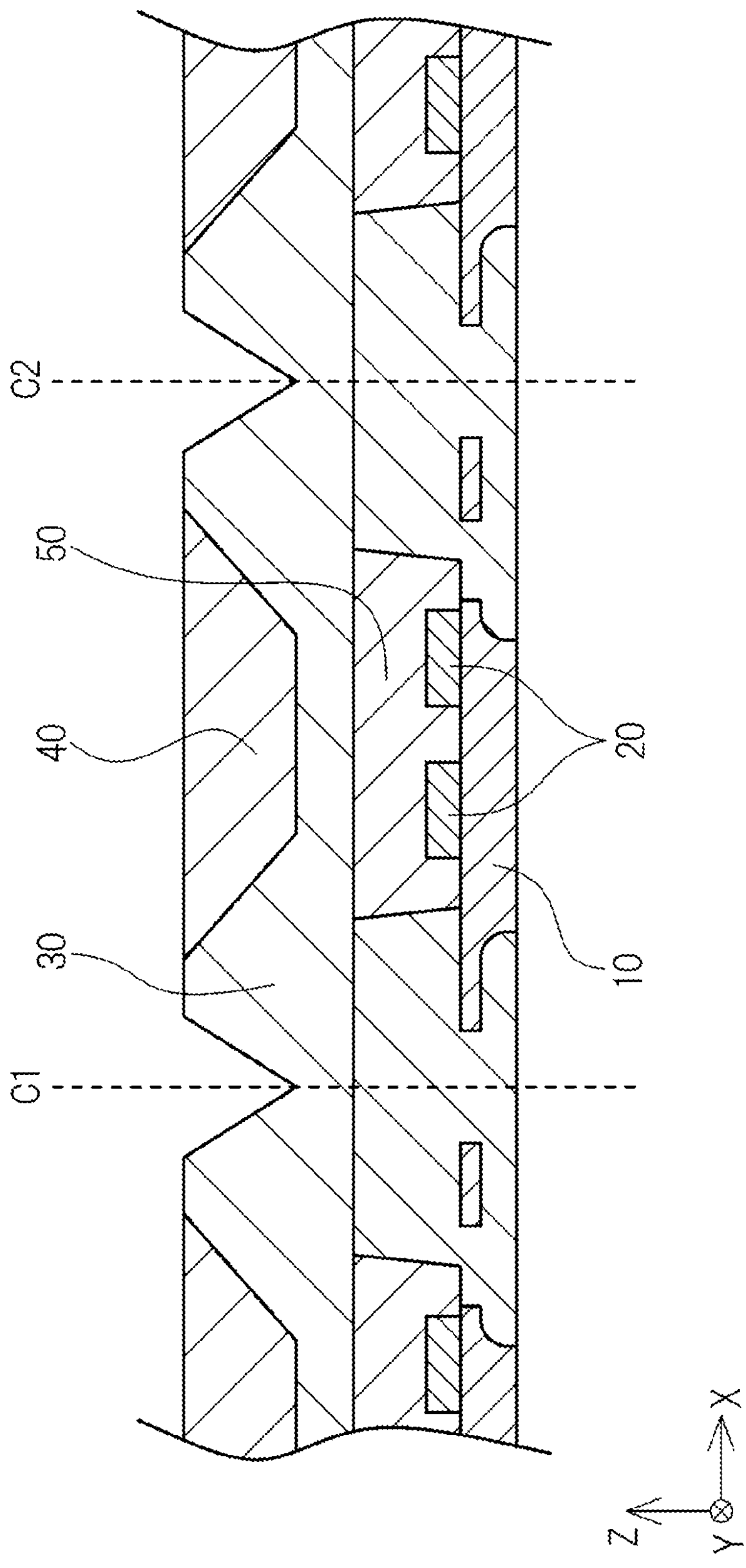
FIG. 6 is a schematic cross-sectional view illustrating a method of manufacturing the light-emitting device according to the present embodiment.

By cutting the structure along the broken line C1 and the broken line C2 as illustrated in FIG. 6, an aggregate of light-emitting devices may be singulated into individual light-emitting devices. In the present description, an aggregate of light-emitting devices refers to a structure in which light-emitting devices before singulation are connected by the support 10 and the first light-transmissive member 30.

The first outer surface 31 may be formed by cutting, and the second outer surface 32 may be formed by using a mold. By so doing, the surface roughness of the first outer surface 31 can be easily made rougher than the surface roughness of the second outer surface 32.

Alternatively, after the first outer surface 31 and the second outer surface 32 are formed by the same method, the surface roughness of the first outer surface 31 may be roughened. For example, after the first outer surface 31 and the second outer surface 32 are formed by using a mold, the surface of the first outer surface 31 may be roughened by blasting.

For example, a resin material can be used as a base material of the first light-transmissive member 30. A thermosetting resin is preferable as the resin used for the base material of the first light-transmissive member 30. Examples of the thermosetting resin include an epoxy resin, a modified epoxy resin, a silicone resin, a modified silicone resin, an acrylate resin, a urethane resin, and a fluorine-based resin. Among them, the silicone resin and the modified silicone resin are preferable because they are good in heat resistance and light resistance. For example, a phenyl silicone resin or a dimethyl silicone resin can be used as the base material of the first light-transmissive member 30.

The first light-transmissive member 30 may contain a light reflective material. By so doing, the light distribution characteristics of the light-emitting device 100 are easily adjusted. As the light reflective material, it is preferable to use a material that hardly absorbs light from the light-emitting element 20 and has a large difference in refractive index with respect to the base material. Examples of such a light reflective material include titanium oxide, zinc oxide, silicon oxide, zirconium oxide, aluminum oxide, and aluminum nitride. The first light-transmissive member 30 may also contain a wavelength conversion member. This makes it easier to adjust the color of light from the light-emitting device 100. The wavelength conversion member contained in the first light-transmissive member 30 may be of one type or a plurality of types. A phosphor contained in the first light-transmissive member 30 may be dispersed or unevenly distributed. As the wavelength conversion member, a known phosphor can be used. Examples of the phosphor that can be used include an yttrium aluminum garnet based phosphor (for example, $Y_3(Al,Ga)_5O_{12}$:Ce), a lutetium aluminum garnet based phosphor (for example, $Lu_3(Al,Ga)_5O_{12}$:Ce), a terbium aluminum garnet based phosphor (for example, $Tb_3(Al,Ga)_5O_{12}$:Ce), a CCA based phosphor (for example, $Ca_{10}(PO_4)_6Cl_2$:Eu), an SAE based phosphor (for example, $Sr_4Al_{14}O_{25}$:Eu), a chlorosilicate based phosphor (for example, $Ca_8MgSi_4O_{16}C_{12}$:Eu), a nitride based phosphor such as a β-SiAlON based phosphor (for example, $(Si,Al)_3(O,N)_4$:Eu), an α-SiAlON based phosphor (for example, $Ca(Si,Al)_{12}(O,N)_{16}$:Eu), an SLA based phosphor (for example, $SrLiAl_3N_4$:Eu), a CASN based phosphor (for example, $CaAlSiN_3$:Eu), or an SCASN based phosphor (for example, $(Sr,Ca)AlSiN_3$:Eu), a fluoride based phosphor such as a KSF based phosphor (for example, $K_2SiF_6$:Mn), a KSAF based phosphor (for example, $K_2(Si,Al)F_6$:Mn), or an MGF based phosphor (for example, $3.5MgO\cdot 0.5MgF_2\cdot GeO_2$:Mn), a phosphor having a perovskite structure (for example, $CsPb(F,Cl,Br,I)_3$), or a quantum dot phosphor (for example, CdSe, InP, $AgInS_2$, or $AgInSe_2$).

Light-Shielding Member 40

The light-shielding member 40 is a member having a light-shielding property against light from the light-emitting element 20. The light-shielding member 40 has a lower transmittance with respect to the peak wavelength of the light-emitting element 20 than the first light-transmissive member 30. The light-shielding member 40 has a transmittance of 40% or less with respect to the peak wavelength of the light-emitting element 20, for example. The light-shielding member 40 covers the upper surface 20S of the light-emitting element 20 via the first light-transmissive member 30. Thus, because light traveling upward from the light-emitting element 20 is shielded by the light-shielding member 40, light emitted from the light-emitting device 100 is likely to have a large component in the lateral direction (the X direction and/or the Y direction). In the plan view, at least a part of the light-emitting element 20 overlaps the light-shielding member 40. In the plan view, the entire light-emitting element 20 included in the light-emitting device 100 preferably overlaps the light-shielding member 40. This makes it easier to shield light traveling upward from the light-emitting element 20. Thus, light emitted from the light-emitting device 100 is likely to have a large component in the lateral direction. The light-shielding member 40 may reflect light from the light-emitting element 20 or may absorb light from the light-emitting element 20. The light-shielding member 40 preferably has reflectivity. By so doing, light from the light-emitting element 20 is less likely to be absorbed by the light-shielding member 40, so that the light extraction efficiency of the light-emitting device 100 is improved.

Figure 7A:
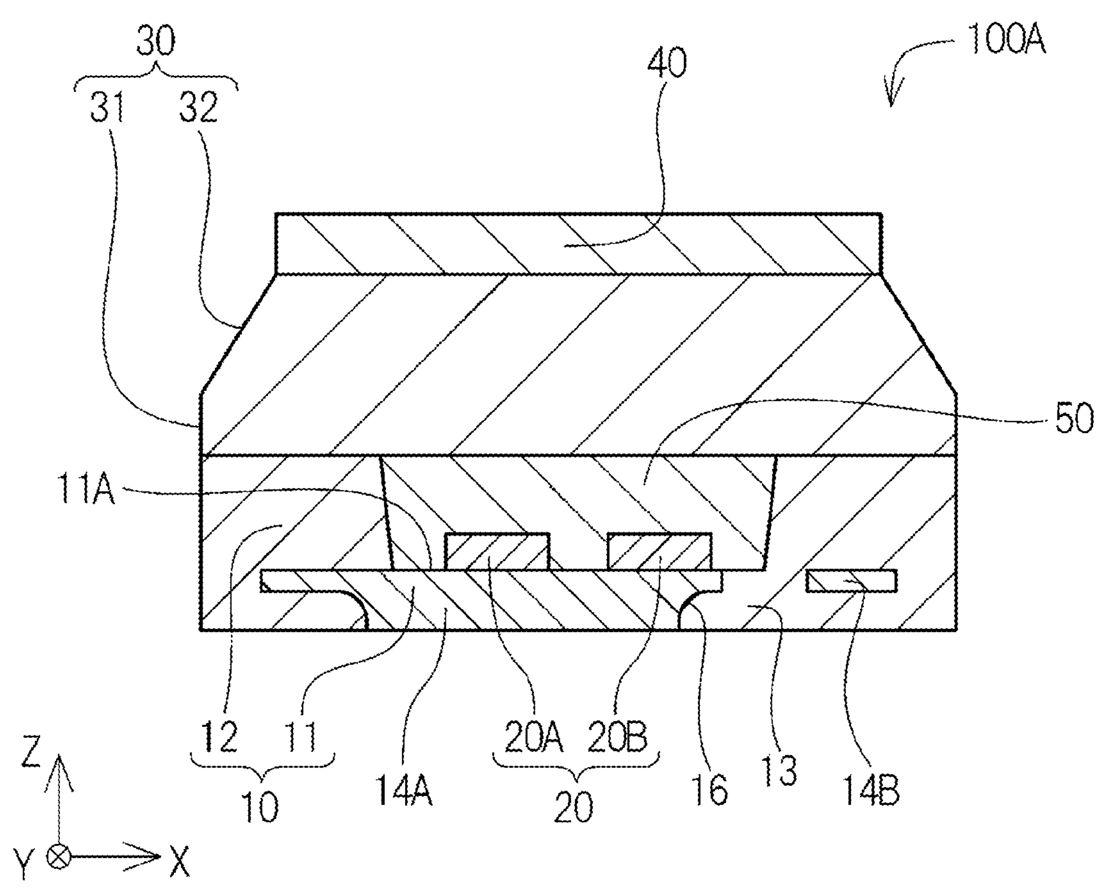
FIG. 7A is a schematic cross-sectional view of another variation of a light-emitting device according to the present embodiment.

As in a light-emitting device 100A illustrated in FIG. 7A, the upper surface of the first light-transmissive member 30 may be flat, or as in the light-emitting device 100 illustrated in FIG. 2, the upper surface of the first light-transmissive member 30 may define a recess 35. When the upper surface of the first light-transmissive member 30 defines the recess 35 as illustrated in FIG. 2, the light-shielding member 40 is preferably disposed in the recess 35. By so doing, when the light-emitting device 100 has the same size in the up and down direction, a size (may be referred to as a thickness) of the light-shielding member 40 in the up and down direction can be increased. By increasing the size of the light-shielding member 40 in the up and down direction, the light-shielding property of the light-shielding member 40 is improved. Thus, the light-shielding member 40 can easily shield light traveling upward from the light-emitting element 20. As illustrated in FIG. 2, in the cross-sectional view, the light-shielding member 40 preferably has a first side 41 that is inclined outwardly toward the top. The light traveling upward from the light-emitting element 20 can be reflected at the position of the first side 41 to be changed into light traveling in the lateral direction. Thus, the light-emitting device 100 can efficiently spread light from the light-emitting element 20 in the lateral direction.

Figure 7B:
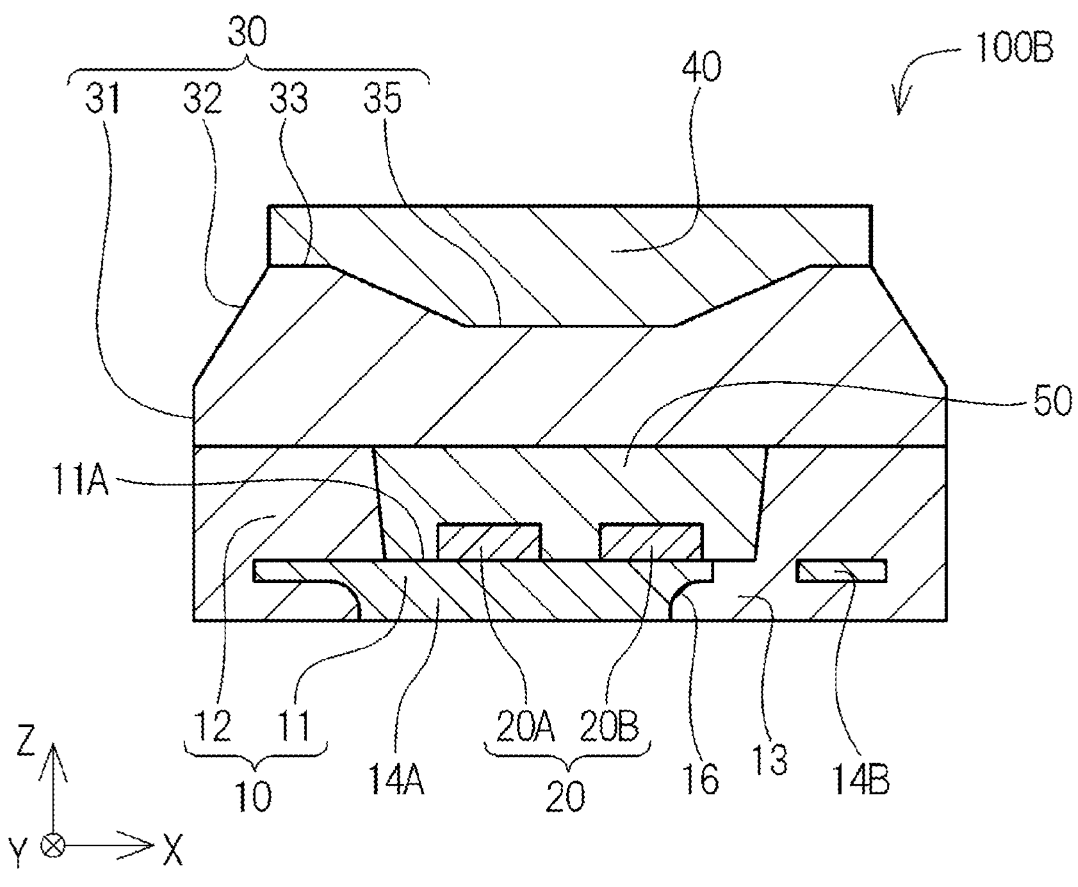
FIG. 7B is a schematic cross-sectional view of yet another variation of a light-emitting device according to the present embodiment.
Figure 7C:
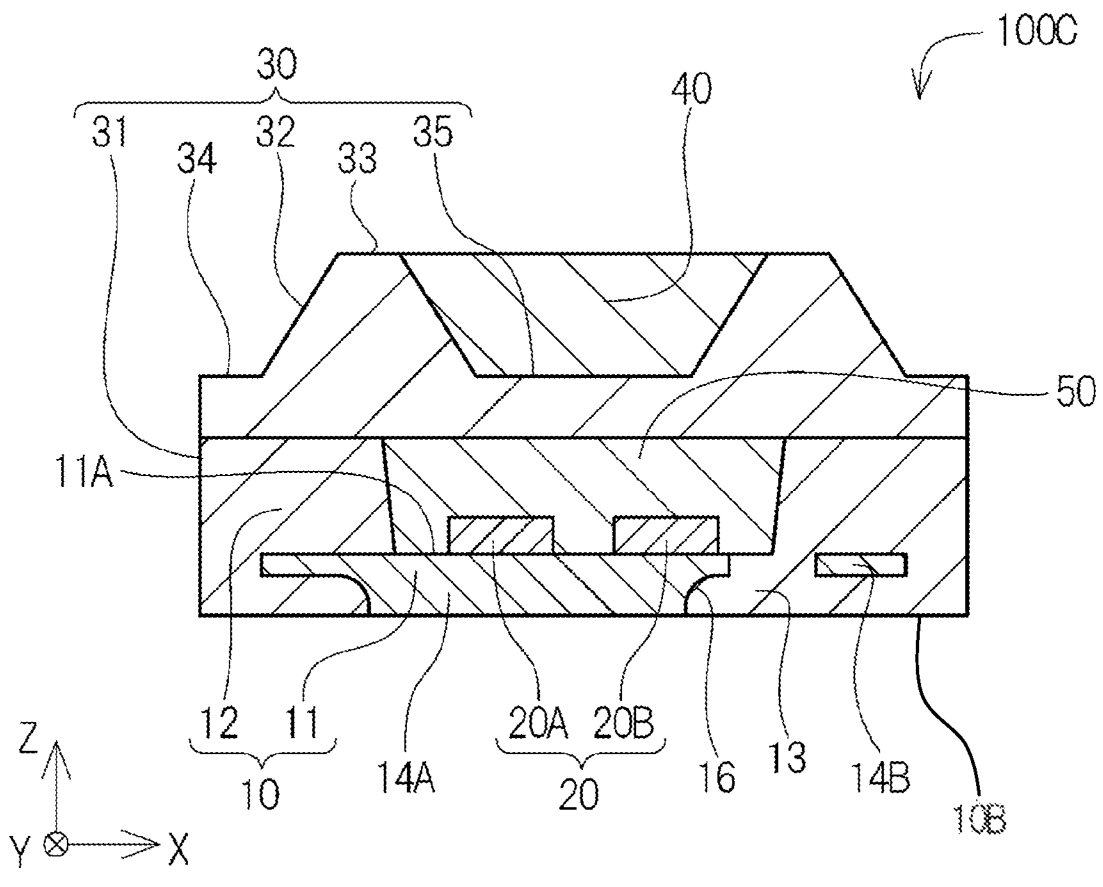
FIG. 7C is a schematic cross-sectional view of yet another variation of a light-emitting device according to the present embodiment.
Figure 8:
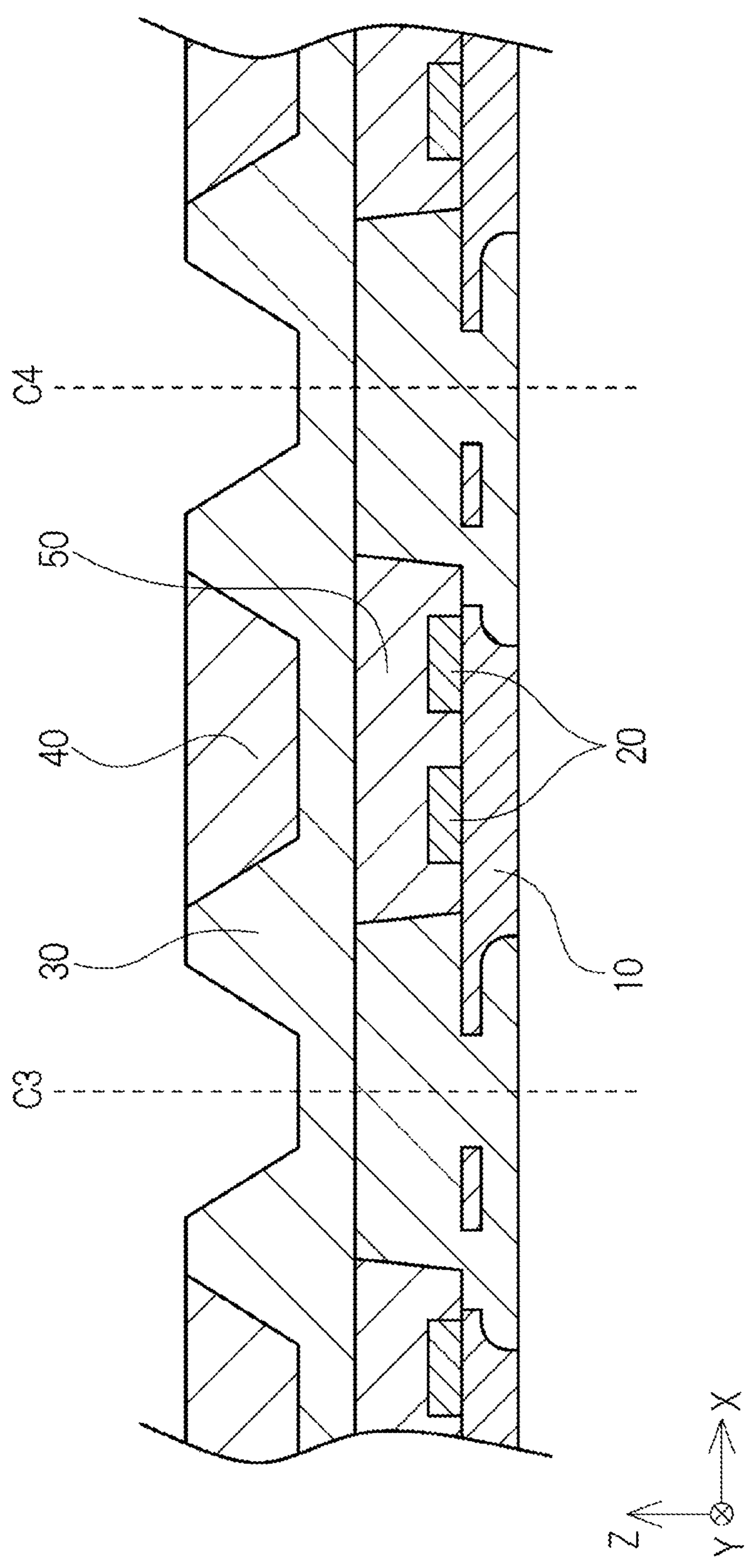
FIG. 8 is a schematic cross-sectional view illustrating an exemplary method of manufacturing the light-emitting device illustrated in FIG. 7C.

As illustrated in FIGS. 2 and 7B, the first light-transmissive member 30 may have a third outer surface 33 that connects the recess 35 and the second outer surface 32. As illustrated in FIG. 2, the third outer surface 33 may be exposed from the light-shielding member 40. By so doing, the light extraction efficiency of the light-emitting device 100 can be improved compared to a case in which the third outer surface 33 is covered with the light-shielding member 40. Alternatively, the third outer surface 33 may be covered with the light-shielding member 40 as in a light-emitting device 100B as illustrated in FIG. 7B. By so doing, the amount of light emitted upward is reduced, and the light-emitting device 100B can emit light having a larger component in the lateral direction than when the third outer surface 33 is exposed from the light-shielding member 40. In the plan view, the third outer surface 33 may surround the light-emitting element 20.

The first outer surface 31 and the second outer surface 32 may be connected to each other as in the light-emitting device 100 illustrated in FIG. 2. As illustrated in FIG. 2, when the first outer surface 31 and the second outer surface 32 are connected to each other, the first light-transmissive member 30 is easily formed. The first light-transmissive member 30 may further have a fourth outer surface 34 that connects the first outer surface 31 and the second outer surface 32, as in a light-emitting device 100C illustrated in FIG. 7C. As in the light-emitting device 100C illustrated in FIG. 7C, when the first light-transmissive member 30 has the fourth outer surface 34, the fourth outer surface 34 and the lower surface 10B of the support 10 are preferably parallel to each other in the cross-sectional view. By so doing, variations in the length of the first outer surface 31 in the up and down direction (the Z direction) are easily suppressed. For example, when the first outer surface 31 is formed by cutting the first light-transmissive member 30 along a broken line C3 and a broken line C4 illustrated in FIG. 8, even though the cutting position is shifted in the lateral direction, the fourth outer surface 34 extends parallel to the lower surface 10B of the support 10 in the cross-sectional view, so that variations in the length of the first outer surface 31 in the up and down direction (the Z direction) are easily suppressed. By suppressing variations in the length of first outer surface 31 in the up and down direction (the Z direction), variations in the light distribution characteristics of the light-emitting device are easily suppressed. In the plan view, the fourth outer surface 34 may surround the light-emitting element 20.

As illustrated in FIG. 2, in the cross-sectional view, the light-shielding member 40 may have a second side 42 facing the light-emitting element 20 and a third side 43 located opposite to the second side 42. The second side 42 is preferably parallel to the lateral direction (the X direction and/or the Y direction). By so doing, even when the position in which the light-emitting element 20 is placed varies in the lateral direction, the light distribution of the light-emitting device can be suppressed from varying because the second side 42 is parallel to the lateral direction.

As a material of the light-shielding member 40, metal may be used, or a resin material containing a light reflective material may be used. When a resin material is used as a base material of the light-shielding member 40, the same resin material as that of the first light-transmissive member 30 can be used. Examples of the light reflective material that can be used include titanium oxide, zinc oxide, silicon oxide, zirconium oxide, aluminum oxide, and aluminum nitride as in the case of the first light-transmissive member. The light reflective material can be contained at a ratio in a range from 10 wt. % to 90 wt. % with respect to the resin material, for example. A difference between a linear expansion coefficient of the base material of the first light-transmissive member 30 and a linear expansion coefficient of the base material of the light-shielding member 40 is not particularly limited, but is preferably within 30 ppm/° C. Thus, the light-shielding member 40 can be suppressed from peeling off from the first light-transmissive member 30. For example, when a phenyl silicone resin is used as the base material of the first light-transmissive member 30, a phenyl silicone resin may be used as the base material of the light-shielding member 40. The first light-transmissive member 30 and the light-shielding member 40 may be in contact with each other, or a known adhesive member may be located between the first light-transmissive member 30 and the light-shielding member 40.

Second Light-Transmissive Member 50

As illustrated in FIG. 2, the light-emitting device 100 may include a second light-transmissive member 50. The second light-transmissive member 50 is a member having translucency to light from the light-emitting element 20. The second light-transmissive member 50 is surrounded by the wall portion 12 and covers the light-emitting element 20. The second light-transmissive member 50 and the light-emitting element 20 may be in contact with each other, or the second light-transmissive member 50 and the light-emitting element 20 may be spaced apart from each other. In the plan view, at least a part of the second light-transmissive member 50 overlaps the light-shielding member 40. In the plan view, the entire second light-transmissive member 50 preferably overlaps the light-shielding member 40. This makes it easier to shield light traveling upward from the light-emitting element 20.

As illustrated in FIG. 2, in the cross-sectional view, a length L1 of the second light-transmissive member 50 in the lateral direction is preferably greater than a length L2 of the second side 42 of the light-shielding member 40 in the lateral direction and is preferably less than a length L3 of the third side 43 of the light-shielding member 40 in the lateral direction. The length of the second light-transmissive member 50 in the lateral direction is assumed to be a maximum value of the length of the second light-transmissive member 50 in the lateral direction. When the length L1 of the second light-transmissive member 50 in the lateral direction is greater than the length L2 of the second side 42 of the light-shielding member 40 in the lateral direction, light emitted from the second light-transmissive member 50 is less likely to be shielded by the light-shielding member 40. This improves the light extraction efficiency of the light-emitting device 100. When the length L1 of the second light-transmissive member 50 in the lateral direction is less than the length L3 of the third side 43 of the light-shielding member 40, light emitted from the second light-transmissive member 50 and traveling upward is easily shielded by the light-shielding member 40. Thus, light emitted from the light-emitting device 100 is likely to have a large component in the lateral direction.

Figure 9:
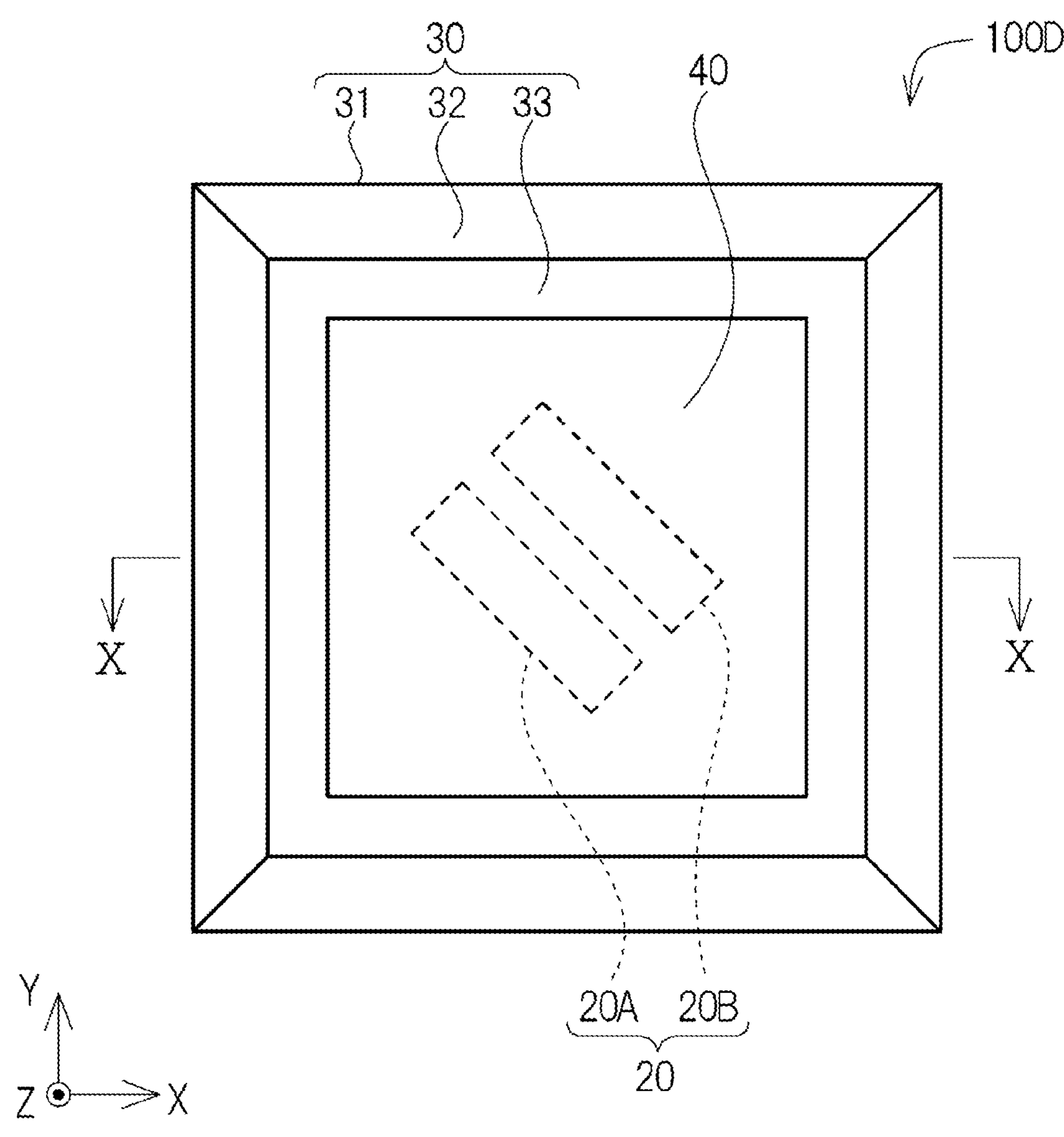
FIG. 9 is a schematic plan view illustrating yet another variation of a light-emitting device according to the present embodiment.

Like the first light-transmissive member 30, the second light-transmissive member 50 may contain a wavelength conversion member. When the second light-transmissive member 50 contains the wavelength conversion member, color adjustment of light from the light-emitting device 100 is facilitated. The wavelength conversion member contained in the second light-transmissive member 50 may be of one type or a plurality of types. The wavelength conversion member contained in the second light-transmissive member 50 may be dispersed or unevenly distributed. The wavelength conversion member contained in the second light-transmissive member 50 is preferably unevenly distributed on the light-emitting element 20 side. That is, the concentration of the wavelength conversion member is preferably higher in a lower portion than in an upper portion, inside the second light-transmissive member 50. This makes it easier to make the thickness of a portion of the second light-transmissive member 50, in which the concentration of the wavelength conversion member is high, substantially constant, thereby easily suppressing color unevenness of light from the light-emitting device. For example, in a manufacturing process, the wavelength conversion member can be unevenly distributed proximate to the light-emitting element 20 by settling down the wavelength conversion member in the second light-transmissive member 50. When the first light-transmissive member 30 contains a wavelength conversion member, the concentration of the wavelength conversion member contained in the second light-transmissive member 50 is preferably higher than the concentration of the wavelength conversion member contained in the first light-transmissive member 30. Because the second light-transmissive member 50 is located closer to the light-emitting element 20 than the first light-transmissive member 30, light from the light-emitting element 20 can be efficiently received on the wavelength conversion member by the concentration of the second light-transmissive member 50 being high. When the light-emitting device 100 includes the second light-transmissive member 50, the first light-transmissive member 30 may contain no wavelength conversion member. When the first light-transmissive member 30 contains no wavelength conversion member, light from the light-emitting element 20 is easily extracted from the first light-transmissive member 30 to the outside of the light-emitting device 100. For example, a resin material can be used as a base material of the second light-transmissive member 50. The same resin material as that of the first light-transmissive member may be used as the base material of the second light-transmissive member 50. A difference between the refractive index of the base material of the first light-transmissive member 30 and the refractive index of the base material of the second light-transmissive member 50 is preferably within 0.05. By so doing, light from the light-emitting element 20 can be suppressed from being reflected or refracted at an interface between the first light-transmissive member 30 and the second light-transmissive member 50. Thus, the light from the light-emitting element 20 is easily introduced from the second light-transmissive member 50 to the first light-transmissive member 30, so that the light extraction efficiency of the light-emitting device 100 is improved. A difference between a linear expansion coefficient of the base material of the first light-transmissive member 30 and a linear expansion coefficient of the base material of the second light-transmissive member 50 is not particularly limited, but is preferably within 30 ppm/° C. Thus, the first light-transmissive member 30 can be suppressed from peeling off from the second light-transmissive member 50. For example, when a phenyl silicone resin is used as the base material of the first light-transmissive member 30, a phenyl silicone resin may be used as the base material of the second light-transmissive member 50. As in a light-emitting device 100D illustrated in FIG. 10, in the cross-sectional view, the upper surface 12S of the wall portion 12 preferably has an inclined surface 12S1 inclined downwardly toward the outside. By so doing, it is possible to reduce a length S1 in the up and down direction (the Z direction) of a portion of the wall portion 12 located at an outer edge of the light-emitting device 100D in the plan view. This makes it easier to increase a length S2 in the up and down direction of a portion of the first light-transmissive member 30 located at the outer edge of the light-emitting device 100D in the plan view, thereby improving the light extraction efficiency of the light-emitting device 100D. As illustrated in FIG. 9, the first outer surface 31 of the first light-transmissive member 30 is located at the outer edge of the light-emitting device 100D in the plan view, so that light emitted from the light-emitting element 20 and having a large component in the lateral direction is easily extracted from the first outer surface 31 of the first light-transmissive member 30 to the outside of the light-emitting device 100D.

The length of the first outer surface 31 in the Z direction is not particularly limited. The length of the first outer surface 31 in the Z direction is preferably, for example, in a range from 0.7 times to 1.3 times the length of the second outer surface 32 in the Z direction. When the length of the first outer surface 31 in the Z direction is 0.7 times or more the length of the second outer surface 32 in the Z direction, an area of the first outer surface 31 can be increased. This makes it easier to extract light from the light-emitting element 20 outward from the first outer surface 31. When the length of the first outer surface 31 in the Z direction is 1.3 times or less the length of the second outer surface 32 in the Z direction, an area of the second outer surface 32 can be increased. This makes it easier to control the light distribution characteristics of the light-emitting device by the second outer surface 32.

Figure 11:
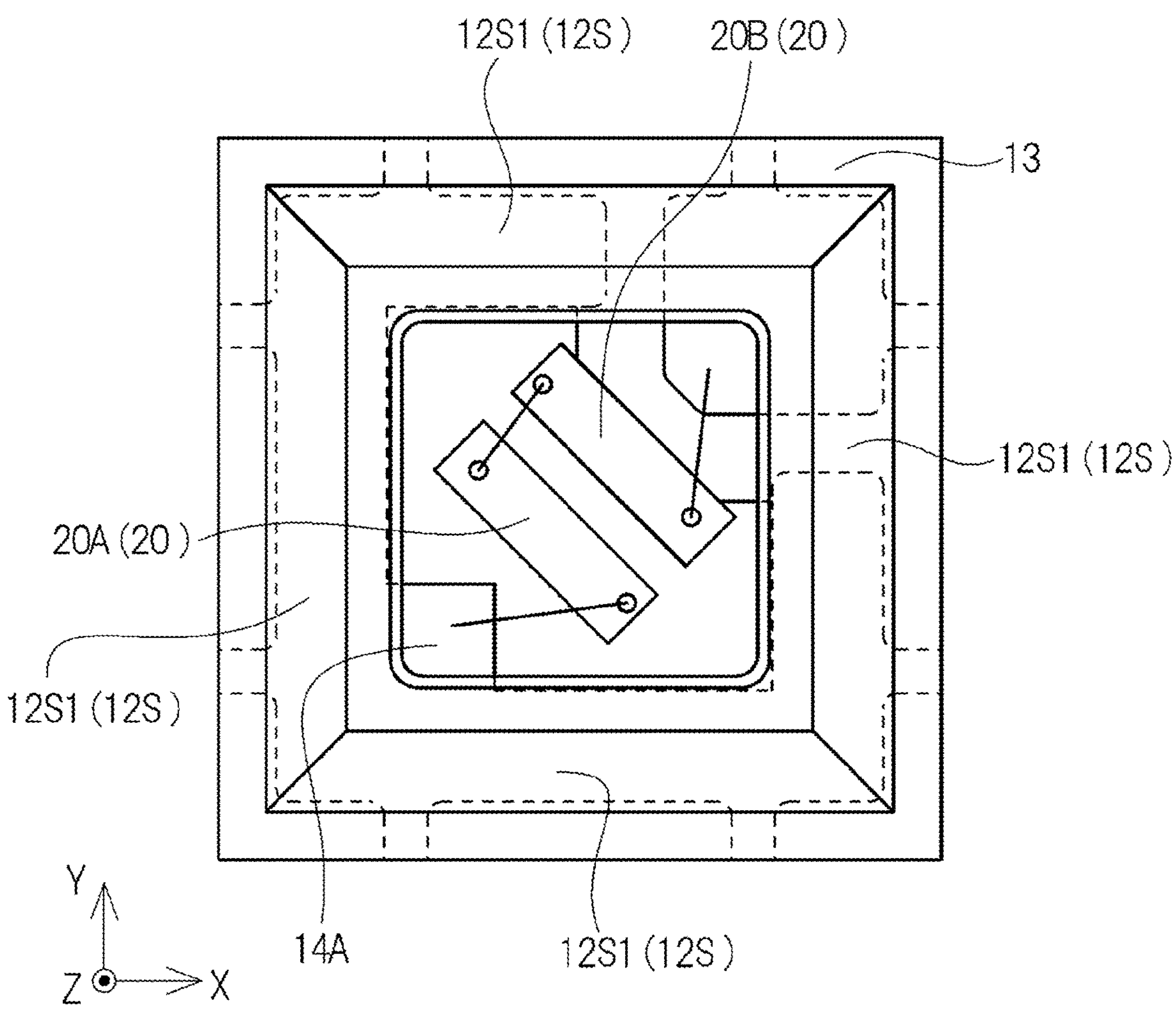
FIG. 11 is a schematic plan view in which a first light-transmissive member, a second light-transmissive member, and a light-shielding member are omitted from the light-emitting device illustrated in FIG. 9.

As illustrated in FIG. 11, the light-emitting element 20 is preferably surrounded by the inclined surface 12S1 in the plan view. By so doing, light from the light-emitting element 20 is easily extracted.

Figure 10:
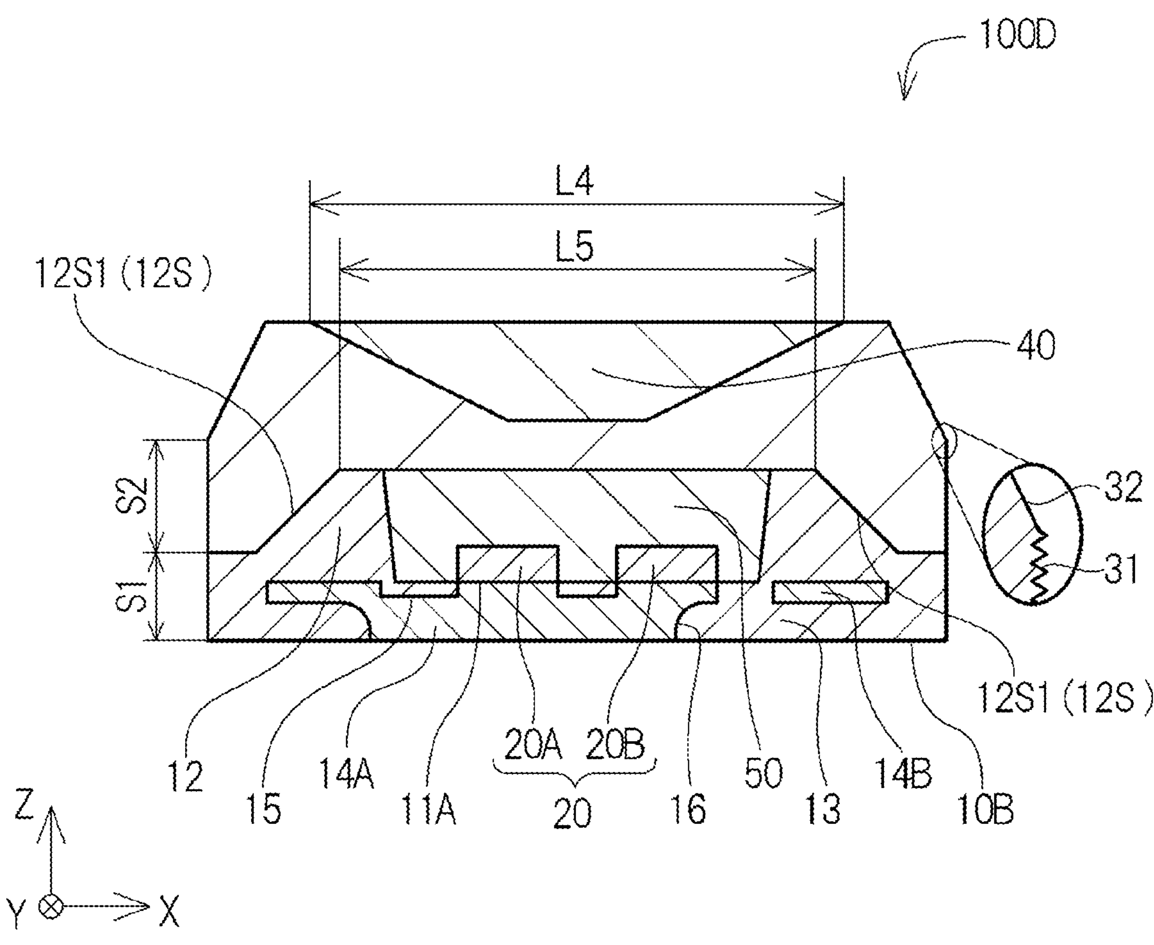
FIG. 10 is a schematic cross-sectional view taken along line X-X illustrated in FIG. 9.

As illustrated in FIG. 10, in the cross-sectional view, a maximum length L4 of the light-shielding member 40 in the lateral direction is preferably greater than the shortest interval L5 between a pair of inclined surfaces 12S1 in the lateral direction. By so doing, light emitted from the second light-transmissive member 50 and traveling upward is easily shielded by the light-shielding member 40. Thus, light emitted from the light-emitting device 100D is likely to have a large component in the lateral direction.

Figure 12A:
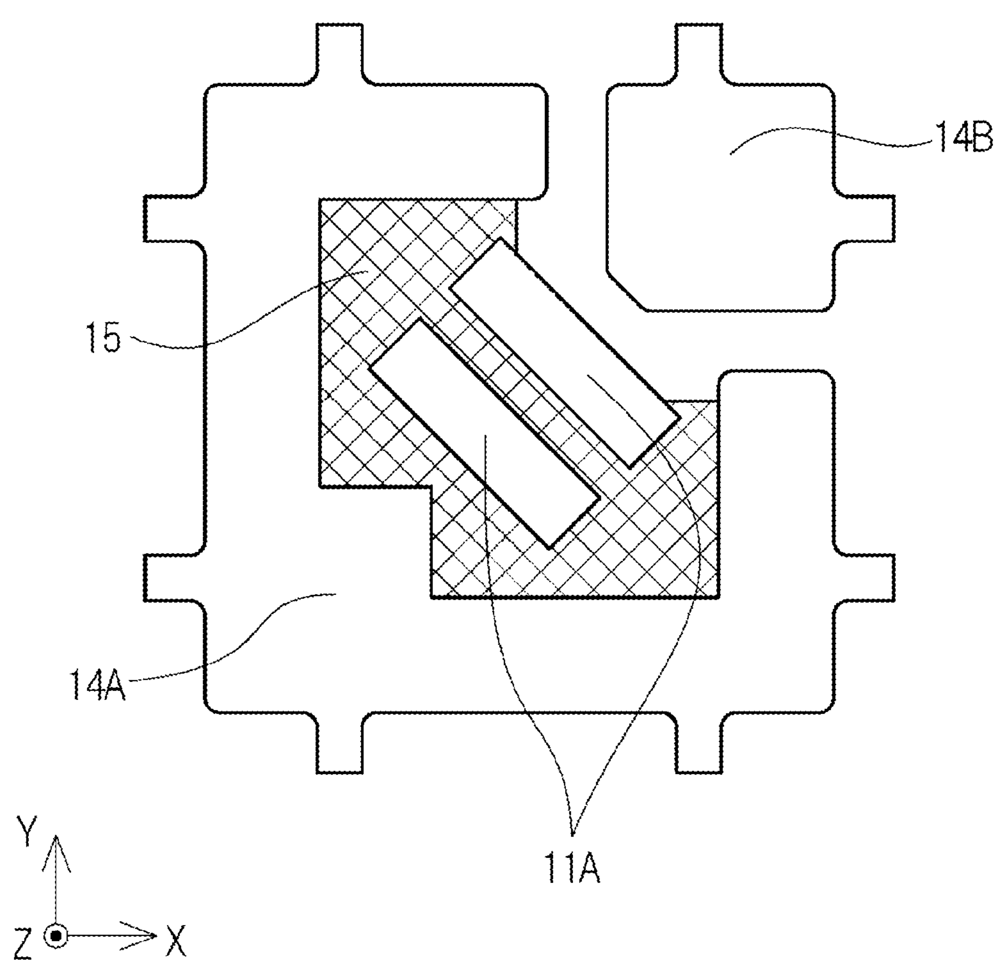
FIG. 12A is a schematic plan view illustrating a first lead and a second lead according to the light-emitting device illustrated in FIG. 9.
Figure 12B:
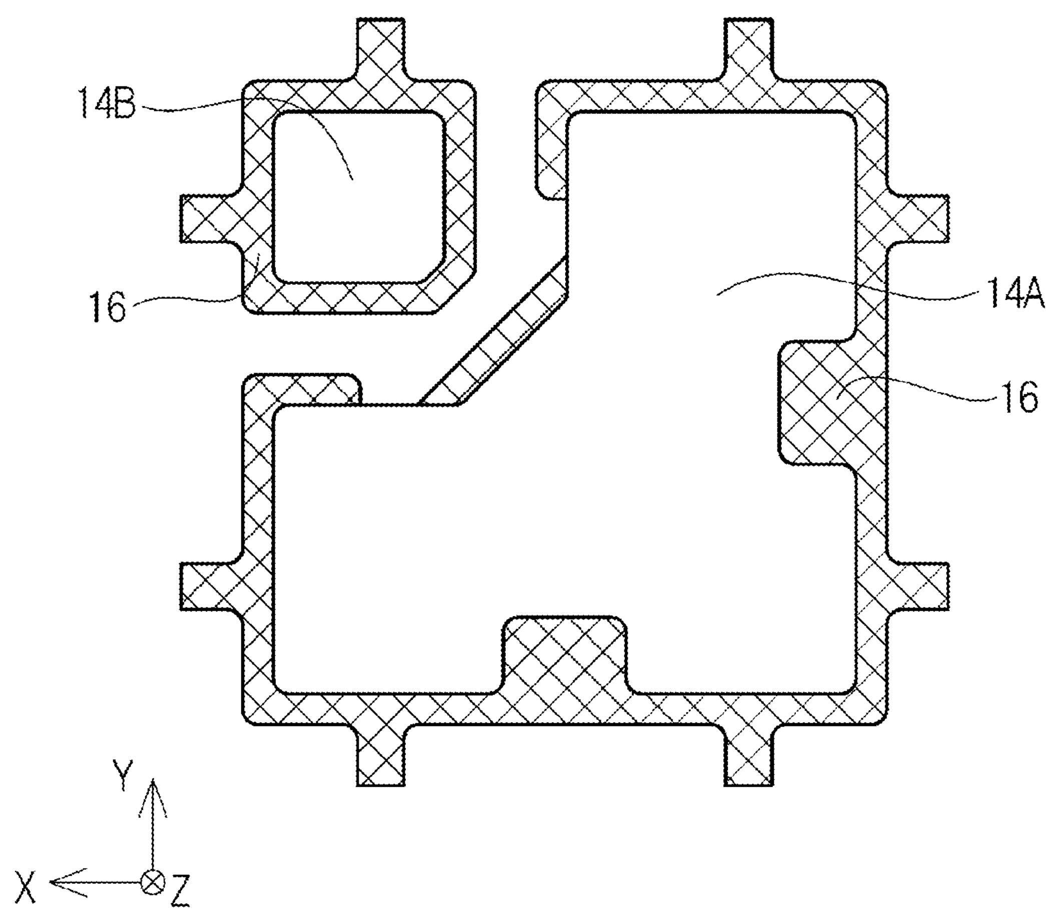
FIG. 12B is a schematic bottom view illustrating the first lead and the second lead according to the light-emitting device illustrated in FIG. 9.

As illustrated in FIG. 12A, the first groove 15 (indicated by hatching) is preferably formed in the upper surface of the first lead 14A to surround the placement surface 11A on which the light-emitting element 20 is placed. When the resin member 13 disposed in the first groove 15 has reflectivity, the light extraction efficiency of the light-emitting device 100D is improved. As illustrated in FIG. 12B, the second groove 16 (indicated by hatching) is preferably formed in the lower surface of the first lead 14A and/or the second lead 14B.

Figure 13A:
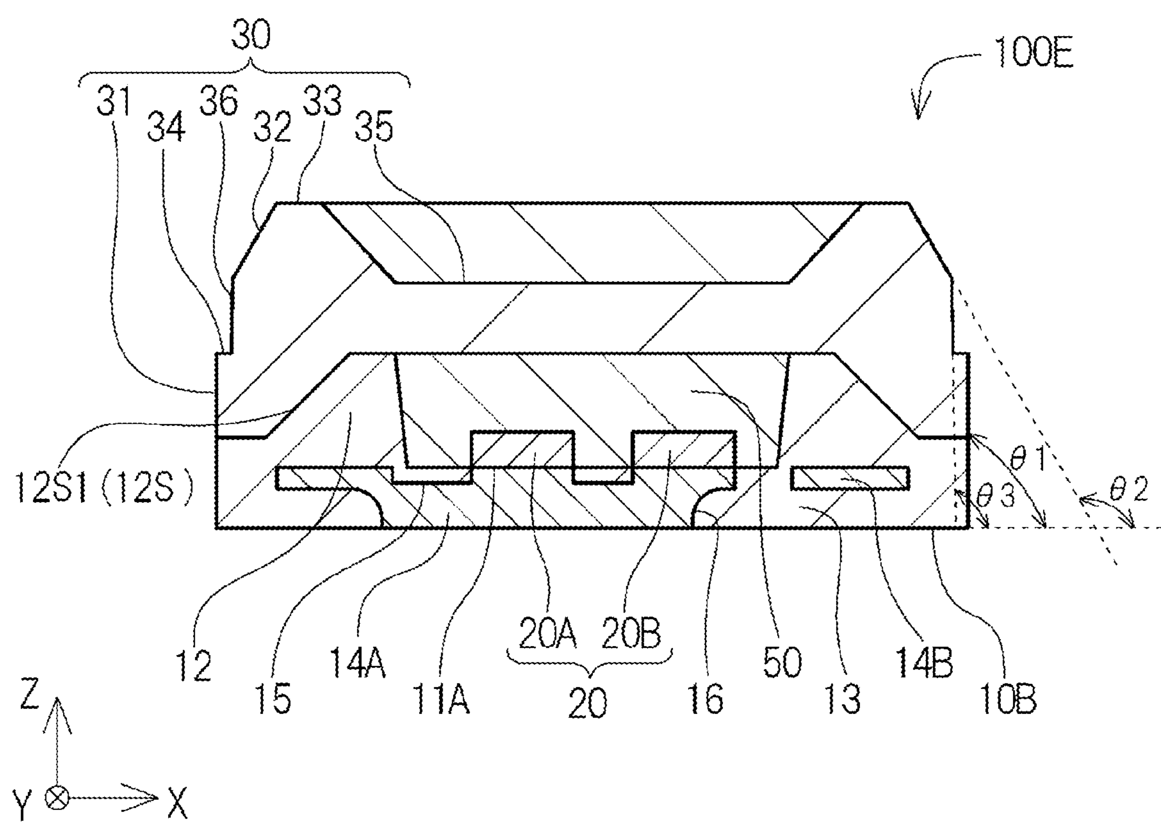
FIG. 13A is a schematic cross-sectional view of yet another variation of a light-emitting device according to the present embodiment.

As in a light-emitting device 100E illustrated in FIG. 13A, the first light-transmissive member 30 may have a fourth outer surface 34 and a fifth outer surface 36 that connect the first outer surface 31 and the second outer surface 32 in the cross-sectional view. When the fourth outer surface 34 is provided as in the light-emitting device 100E illustrated in FIG. 13A, the fourth outer surface 34 and the lower surface 10B of the support 10 are preferably parallel to each other in the cross-sectional view. By so doing, variations in the length of the first outer surface 31 in the up and down direction (the Z direction) are easily suppressed.

In the cross-sectional view, a third angle θ3 formed by the fifth outer surface 36 and the lower surface 10B of the support 10 is preferably equal to the first angle θ1 or greater than the first angle θ1. By so doing, when the fifth outer surface 36 is formed by a mold, the first light-transmissive member 30 having the fifth outer surface 36 is easily removed from the mold. In the present description, the third angle θ3 is an angle formed by a plane including the fifth outer surface 36 and the plane including the lower surface 10B of the support 10. As illustrated in FIG. 13A, the third angle θ3 is an angle defined by a point at which the plane including the fifth outer surface 36 and the plane including the lower surface 10B of the support 10 intersect with each other and refers to an angle located farther from the center of the light-emitting device among the angles located above the lower surface 10B of the support. For example, the fifth outer surface 36 is inclined in a direction away from the center of the light-emitting device toward the lower surface 10B of the support 10.

In the cross-sectional view, the third angle θ3 is preferably less than the second angle θ2. By so doing, the fifth outer surface 36 is less likely to receive light emitted from the light-emitting element 20 and traveling upward. This makes it easier to extract light having a large component in the lateral direction from the fifth outer surface 36 to the outside of the light-emitting device 100E. The third angle θ3 is not particularly limited but is preferably greater than 90° and 97° or less. When the third angle θ3 is greater than 90° and the fifth outer surface 36 is formed by a mold, the first light-transmissive member 30 having the fifth outer surface 36 is easily removed from the mold. When the third angle θ3 is 97° or less, light having a large component in the lateral direction is easily extracted from the fifth outer surface 36 to the outside of the light-emitting device 100E.

Figure 13B:
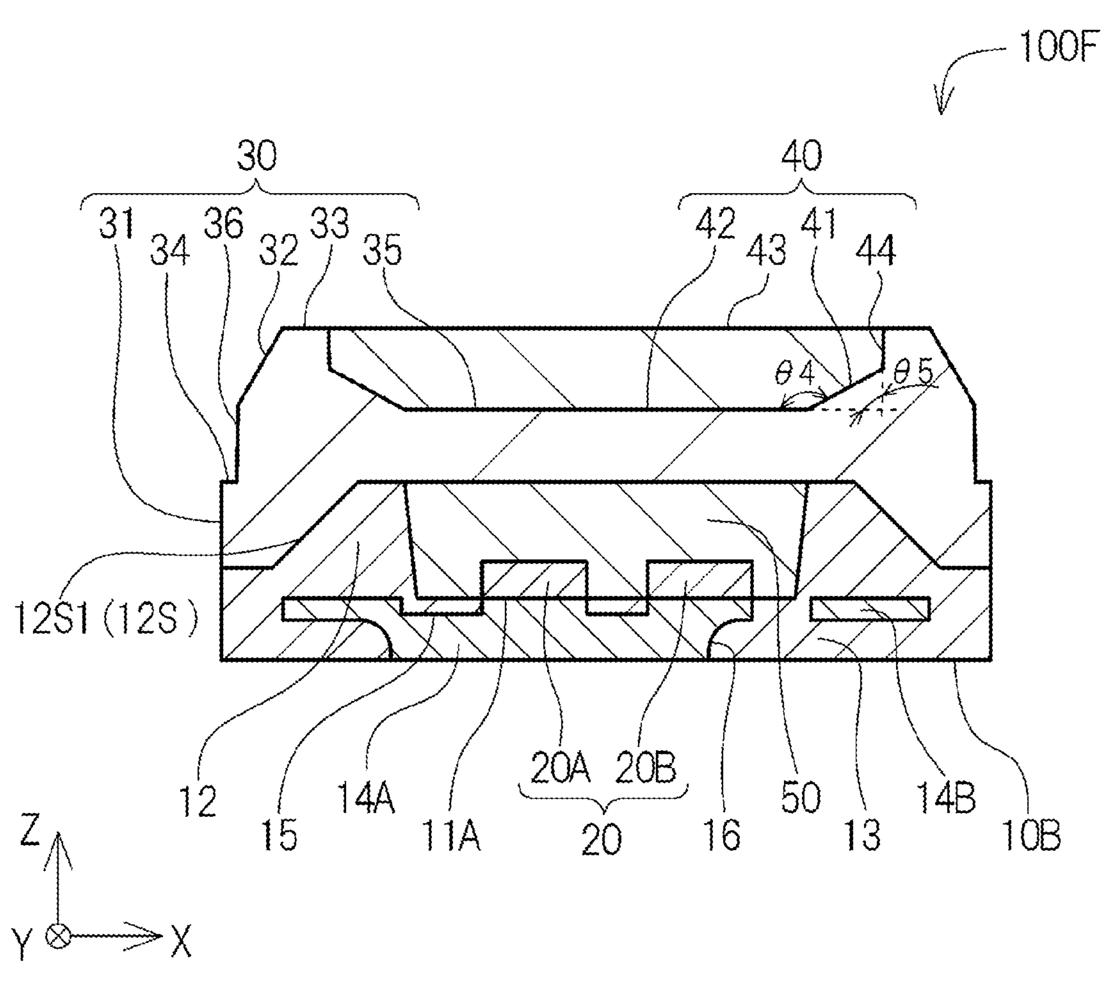
FIG. 13B is a schematic cross-sectional view of yet another variation of a light-emitting device according to the present embodiment.

As in a light-emitting device 100F illustrated in FIG. 13B, the light-shielding member 40 may have a fourth side (interface) 44 that connects a first side (interface) 41 inclined outwardly toward the top and a third side (interface) 43 located opposite to a second side (interface) 42 facing the light-emitting elements 20 in the cross-sectional view. In the cross-sectional view, a fourth angle θ4 formed by the first side 41 and the second side 42 is preferably greater than a fifth angle θ5 formed by the fourth side 44 and the second side 42. By so doing, light traveling upward from the light-emitting element 20 is easily reflected at the position of the first side 41. When the fifth angle θ5 formed by the fourth side 44 and the second side 42 is less than the fourth angle θ4 formed by the first side 41 and the second side 42, variations in the length of the light-shielding member 40 in the lateral direction (the X direction and/or the Y direction) are easily suppressed. In the present description, the fourth angle θ4 is an angle formed by a plane including the first side (interface) 41 and a plane including the second side (interface) 42. As illustrated in FIG. 13B, the fourth angle θ4 refers to an angle (that is, an interior angle) located inside the recess 35 and above the second side (interface) 42. The fifth angle θ5 is an angle formed by a plane including the fourth side (interface) 44 and the plane including the second side (interface) 42. As illustrated in FIG. 13B, the fifth angle θ5 is an angle defined by a point at which the plane including the fourth side (interface) 44 and the plane including the second side (interface) 42 intersect with each other and refers to an angle located closer to the center of the light-emitting device among angles located above the fourth side (interface) 44. The fourth side (interface) 44 is inclined in a direction approaching the center of the light-emitting device toward the lower surface 10B of the support 10. The second side (interface) 42 of the light-shielding member 40 illustrated in FIG. 13B extends in the lateral direction (the X direction).

When the light-shielding member 40 is a resin member containing a light reflective material, the light reflective material may be dispersed or unevenly distributed in the resin member. The light reflective material contained in the light-shielding member 40 is preferably unevenly distributed proximate to a bottom surface of the recess 35. That is, the concentration of the light reflective material is preferably higher in a lower portion than in an upper portion, inside the light-shielding member 40. By so doing, because the light-shielding member 40 has a portion with a high concentration of the light reflective material, the light-shielding member 40 easily shields a part of light traveling upward from the light-emitting element 20.

Figure 14:
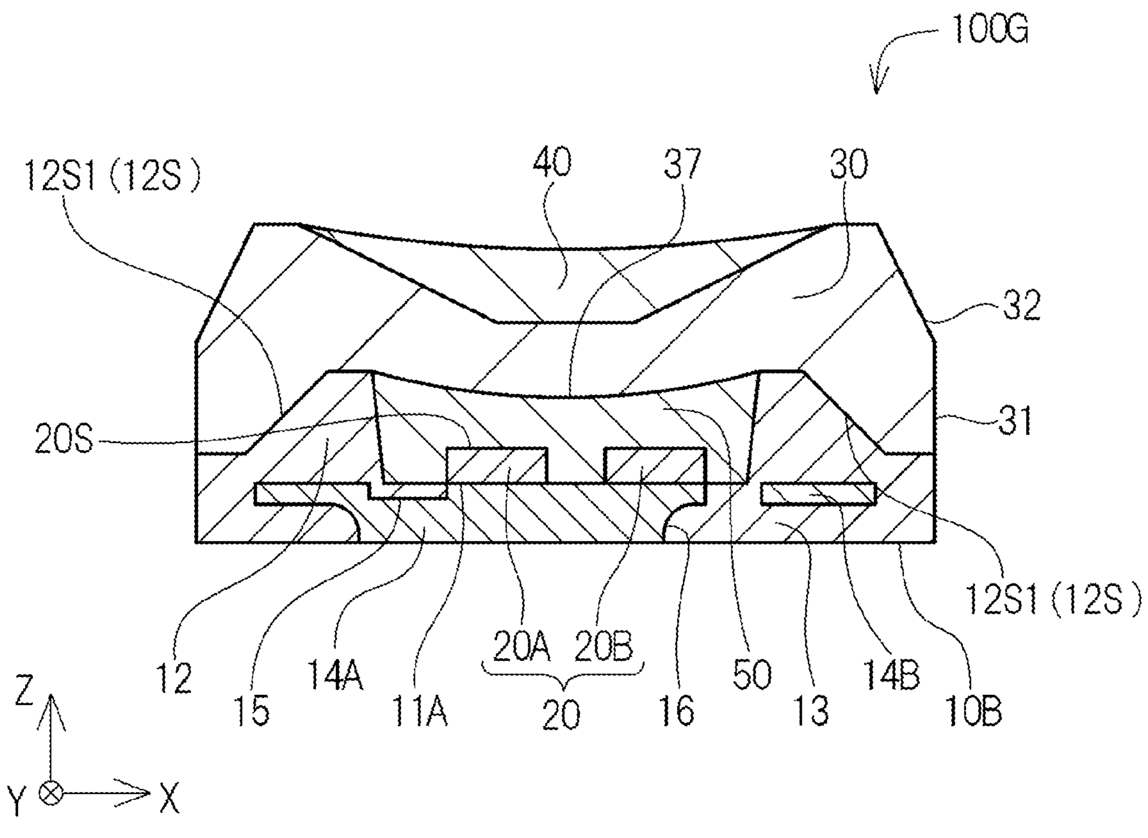
FIG. 14 is a schematic cross-sectional view illustrating yet another variation of a light-emitting device according to the present embodiment.

As in a light-emitting device 100G illustrated in FIG. 14, the lower surface of the first light-transmissive member 30 facing the upper surface 20S of the light-emitting element 20 preferably includes a convex portion 37. This makes it easier to increase a contact area between the first light-transmissive member 30 and the second light-transmissive member 50. This improves adhesion between the first light-transmissive member 30 and the second light-transmissive member 50. When the refractive indexes of the first light-transmissive member 30 and the second light-transmissive member 50 are different from each other, the light distribution characteristics of the light-emitting device 100G are easily controlled by the convex portion 37 of the first light-transmissive member 30. When the refractive indexes of the first light-transmissive member 30 and the second light-transmissive member 50 are different from each other, light from the light-emitting element 20 is refracted at an interface between the first light-transmissive member 30 and the second light-transmissive member 50, resulting in a change in the direction of the light. Because the first light-transmissive member 30 includes the convex portion 37, the direction in which light from the light-emitting element 20 travels can be controlled by the convex portion 37 at the interface between the first light-transmissive member 30 and the second light-transmissive member 50. This makes it easier to control the light distribution characteristics of the light-emitting device 100G. The lower surface of the first light-transmissive member 30 facing the upper surface 20S of the light-emitting element 20 may include a concave portion. This improves the adhesion between the first light-transmissive member 30 and the second light-transmissive member 50. When the refractive indexes of the first light-transmissive member 30 and the second light-transmissive member 50 are different from each other, the light distribution characteristics of the light-emitting device are easily controlled by the concave portion of the first light-transmissive member 30.

Figure 15:
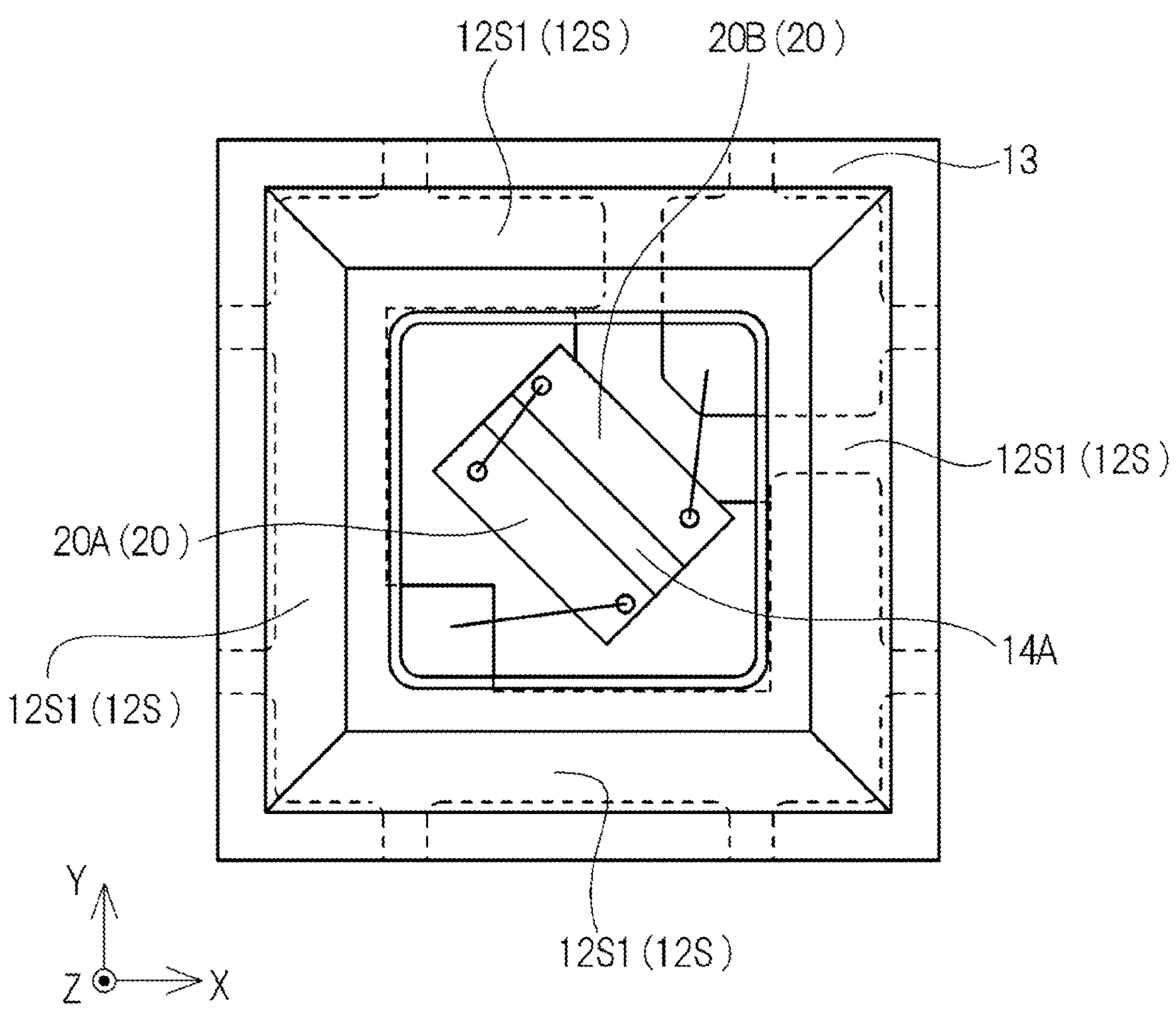
FIG. 15 is a schematic plan view in which a first light-transmissive member, a second light-transmissive member, and a light-shielding member are omitted from the light-emitting device illustrated in FIG. 14.

As illustrated in FIG. 15, the first groove 15 need not be formed in a portion of the upper surface of the first lead 14A located between the first light-emitting element 20A and the second light-emitting element 20B in the plan view. That is, the portion of the upper surface of the first lead 14A located between the first light-emitting element 20A and the second light-emitting element 20B may be exposed from the resin member 13. For example, when the reflectance of the first lead 14A with respect to the peak wavelength of light emitted from the first light-emitting element 20A and/or the second light-emitting element 20B is higher than that of the resin member 13, the portion of the upper surface of the first lead 14A located between the first light-emitting element 20A and the second light-emitting element 20B is exposed from the resin member 13, so that the light extraction efficiency of the light-emitting device is improved.

Figure 16:
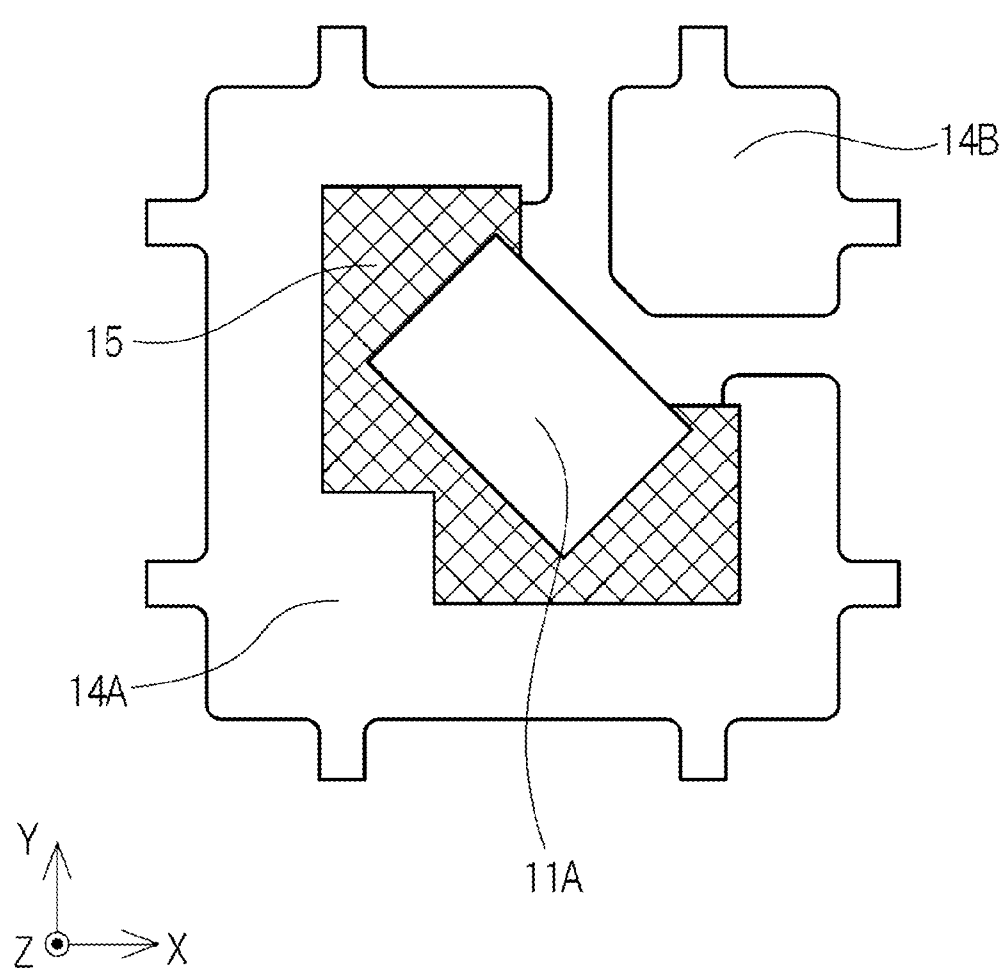
FIG. 16 is a schematic plan view illustrating a first lead and a second lead according to the light-emitting device illustrated in FIG. 14.

As illustrated in FIG. 16, the first groove 15 (indicated by hatching) is preferably formed in the upper surface of the first lead 14A to surround the placement surface 11A on which the first light-emitting element 20A and the second light-emitting element 20B are placed. This improves adhesion between the resin member 13 and the first lead 14A. Because the resin member 13 is disposed in the first groove 15, an area of the first lead 14A exposed from the resin member 13 can be reduced by forming the first groove 15 in the upper surface of the first lead 14A. This can suppress sulfuration of the first lead 14A.

Figure 17:
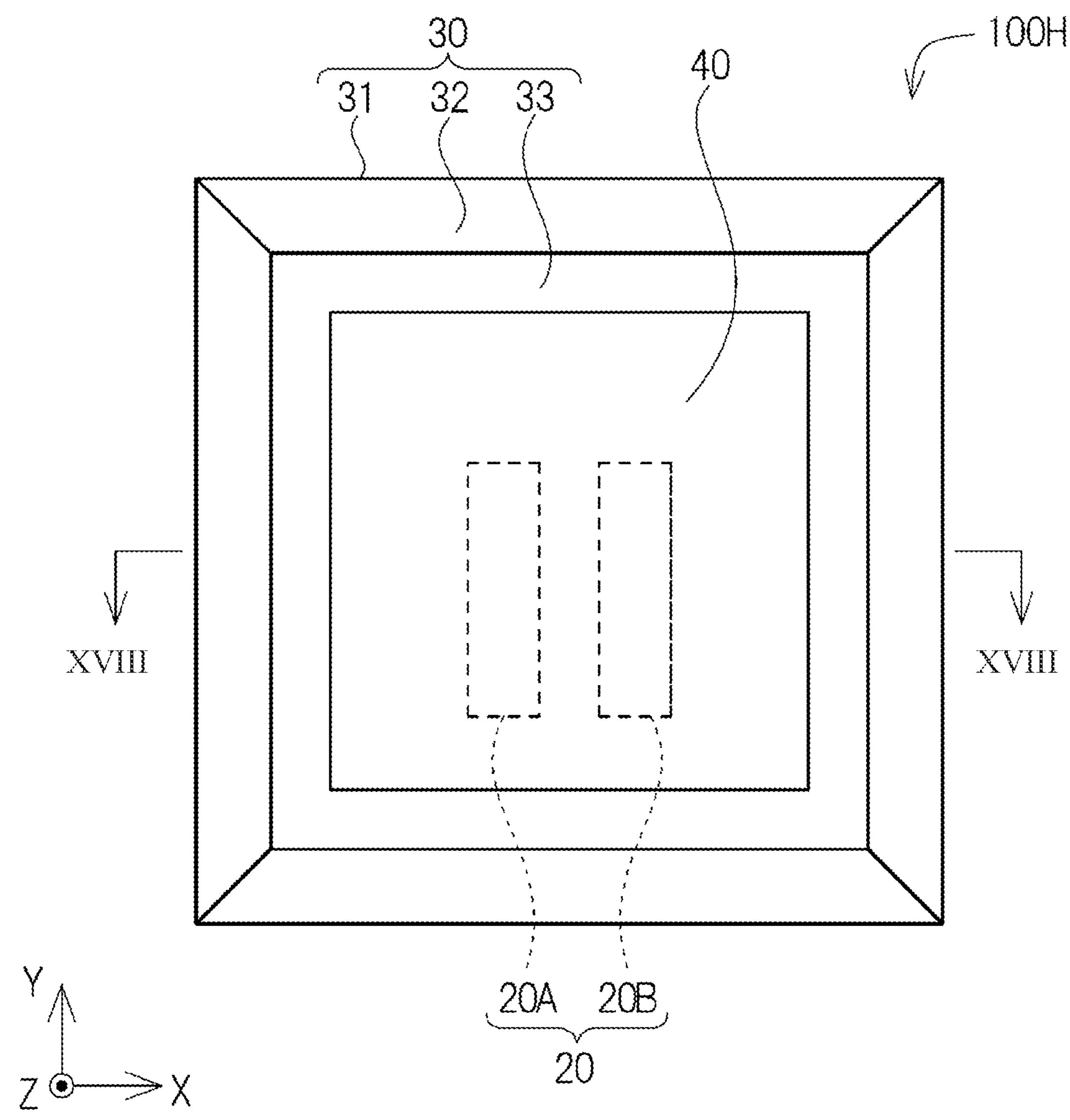
FIG. 17 is a schematic plan view illustrating yet another variation of a light-emitting device according to the present embodiment.
Figure 18:
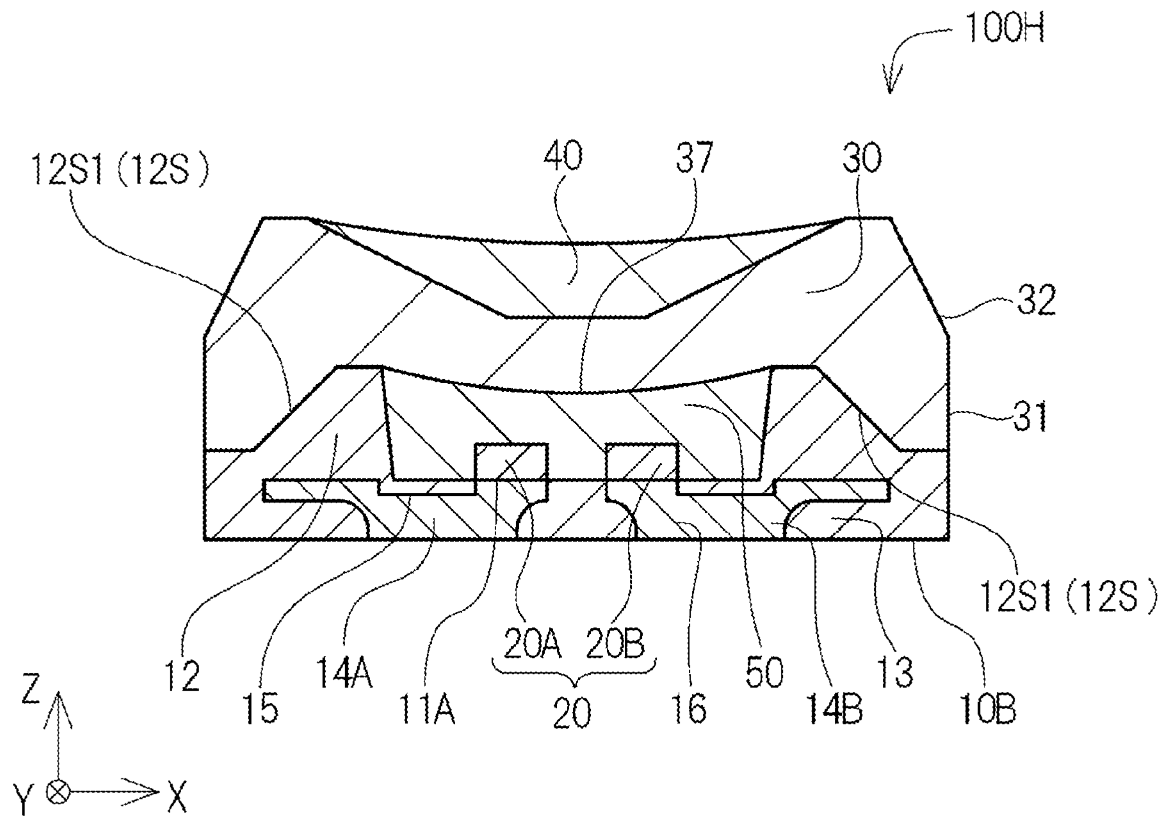
FIG. 18 is a schematic cross-sectional view taken along line XVIII-XVIII illustrated in FIG. 17.
Figure 19:
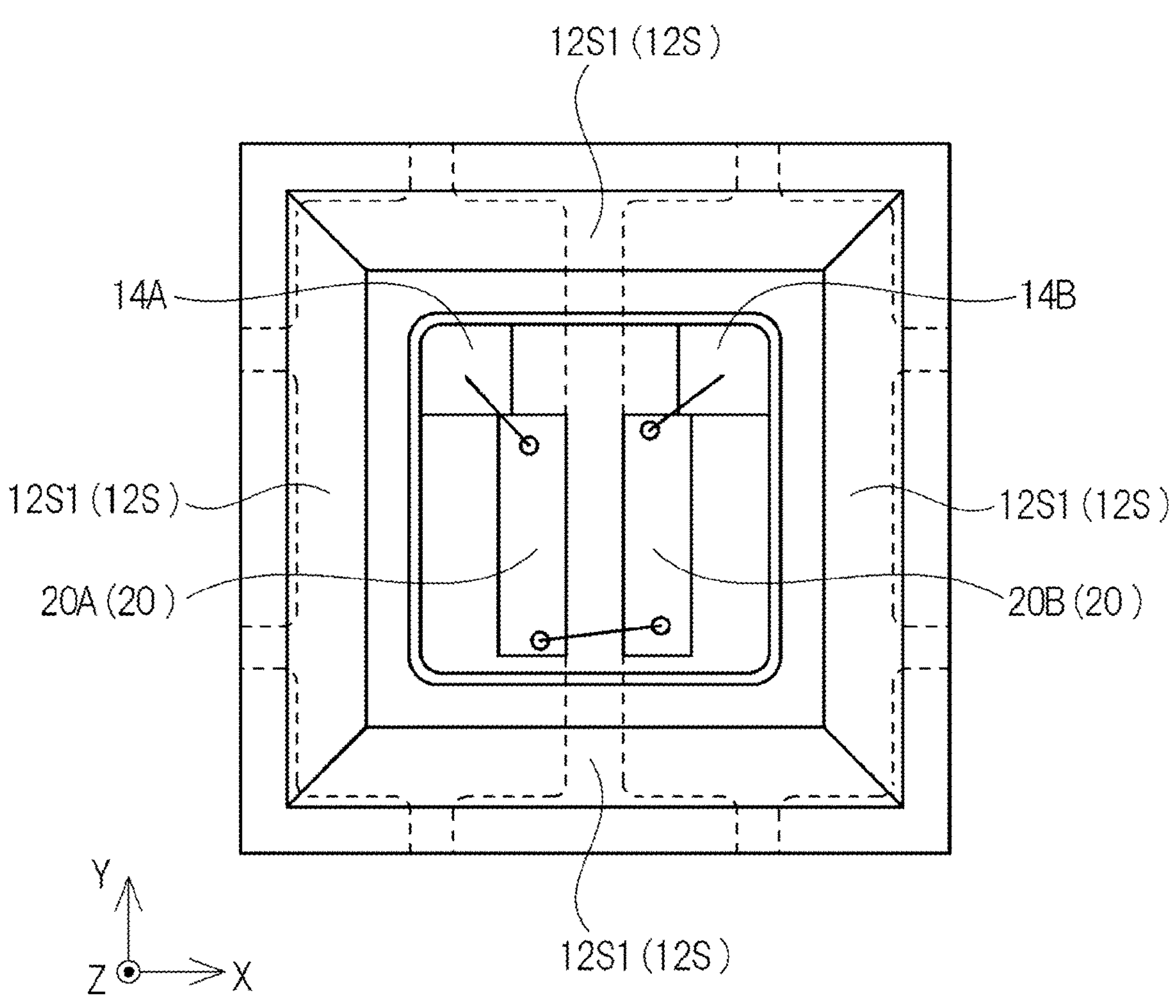
FIG. 19 is a schematic plan view in which a first light-transmissive member, a second light-transmissive member, and a light-shielding member are omitted from the light-emitting device illustrated in FIG. 17.
Figure 20:
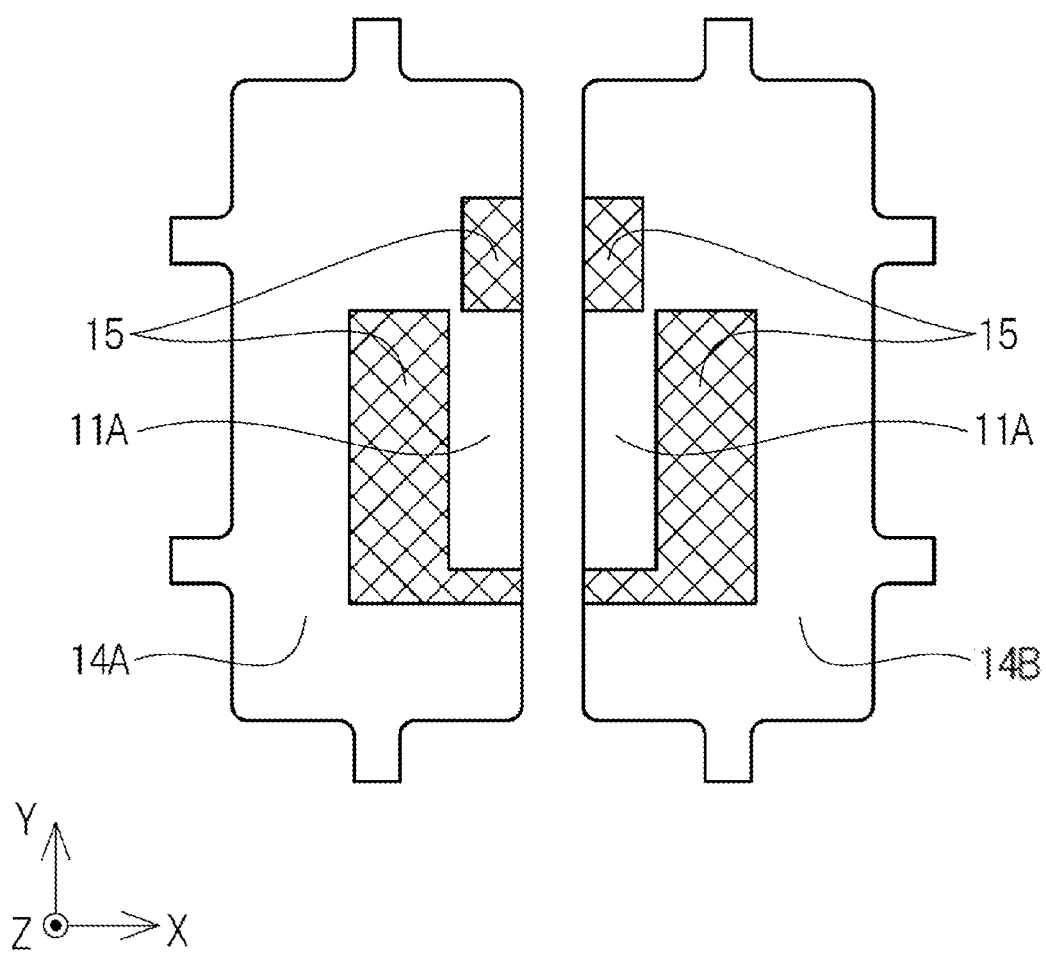
FIG. 20 is a schematic plan view illustrating a first lead and a second lead according to the light-emitting device illustrated in FIG. 17.

As in a light-emitting device 100H illustrated in FIG. 17, one side of the rectangular outer edge of the light-emitting element 20 may be parallel to the X direction or the Y direction in the plan view. In the example illustrated in FIGS. 18 and 19, the first light-emitting element 20A is placed on the first lead 14A and the second light-emitting element 20B is placed on the second lead 14B. In this case, as illustrated in FIG. 20, the first groove 15 may be formed in the upper surface of the first lead 14A to surround the placement surface 11A on which the first light-emitting element 20A is placed, and the first groove 15 may be formed in the upper surface of the second lead 14B to surround the placement surface 11A on which the second light-emitting element 20B is placed.

Figure 21:
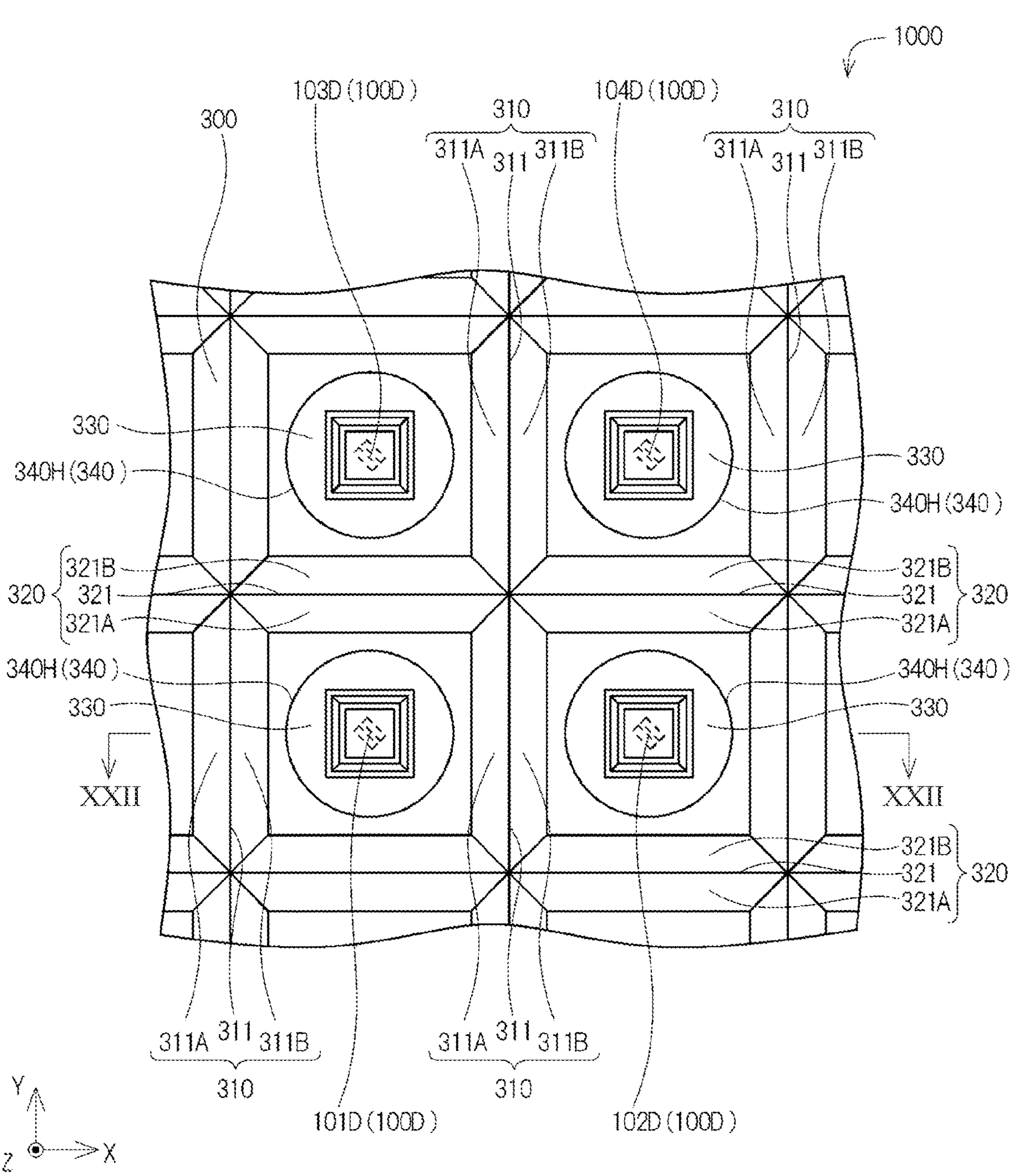
FIG. 21 is a schematic plan view of a planar light source according to the present embodiment.
Figure 22:
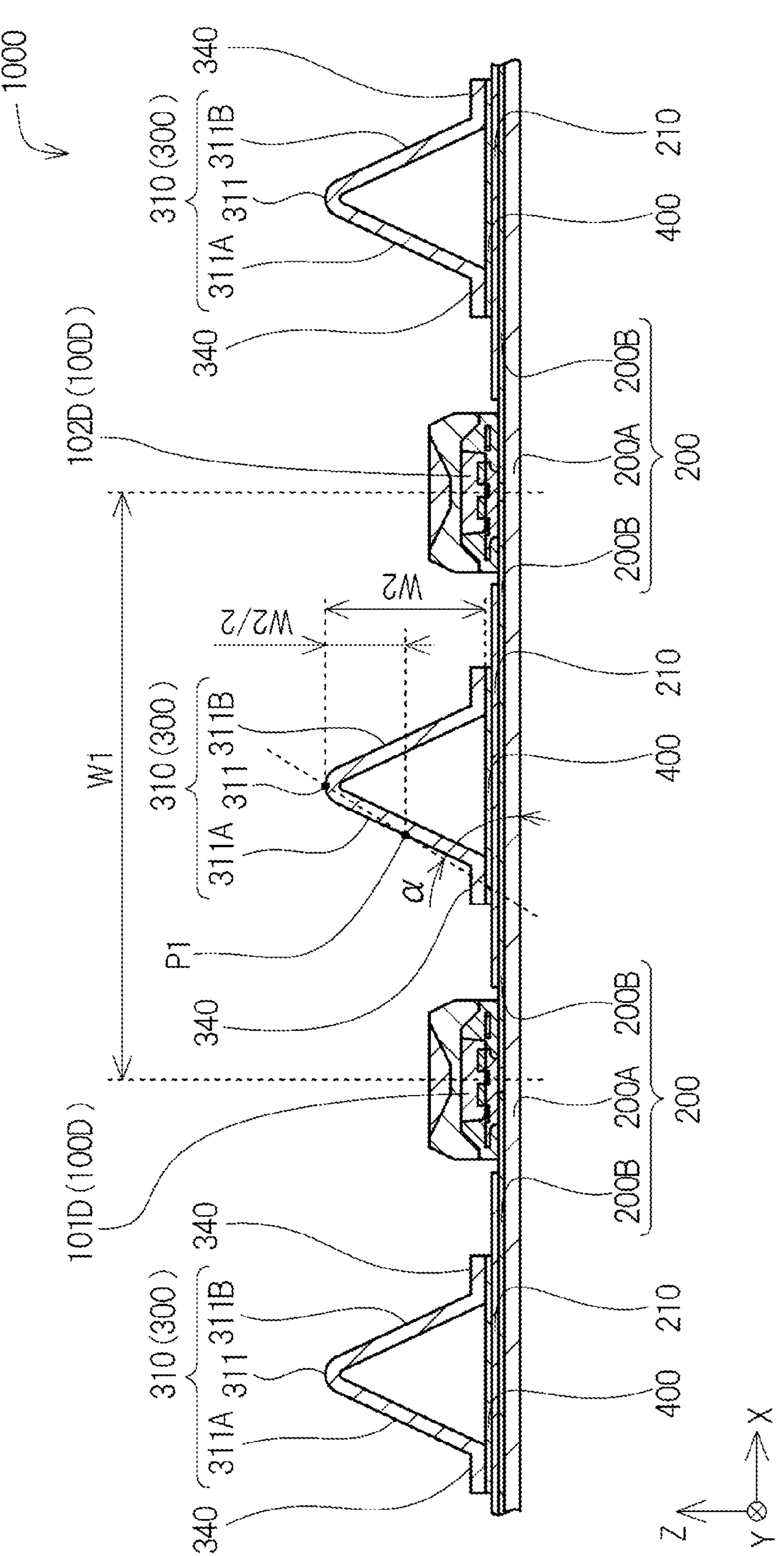
FIG. 22 is a schematic cross-sectional view taken along line XXII-XXII illustrated in FIG. 21.

A planar light source 1000 illustrated in FIGS. 21 and 22 includes a plurality of light-emitting devices 100D, a substrate 200, and at least one partition member 300. The plurality of light-emitting devices 100D are disposed on the substrate 200. The at least one partition member 300 is disposed on the substrate 200. It is assumed that the expression “disposed on the substrate” includes both a case in which the partition member and the like are directly disposed on an upper surface of the substrate and a case in which the partition member and the like are indirectly disposed on an upper surface of the substrate with an adhesive member or the like interposed therebetween. A light-emitting device included in the planar light source 1000 is not limited to the light-emitting device 100D. The planar light source 1000 may include the light-emitting devices described above such as the light-emitting device 100.

Substrate 200

The substrate 200 is a member used to place a plurality of light-emitting devices. The substrate 200 includes a base body 200A and a conductive wiring line 200B disposed on an upper surface of the base body 200A. The conductive wiring line 200B is electrically connected to the light-emitting device 100D and supplies electric power to the light-emitting device 100D. A part of a region of the conductive wiring line 200B, which is not electrically connected to the light-emitting device 100D, is preferably covered with a covering member 210.

Any material can be used for a material of the base body 200A as long as it can isolate at least a pair of conductive wiring lines 200B, and examples of the material include ceramics, resins, and composite materials. Examples of the resin include a phenol resin, an epoxy resin, a polyimide resin, a BT resin, polyphthalamide (PPA), and polyethylene terephthalate (PET). Examples of the composite material include a mixture of any one of the above-mentioned resins and inorganic filler such as glass fiber, silicon oxide, titanium oxide, and aluminum oxide, a glass fiber reinforced resin (glass epoxy), and a metal substrate in which a metal member is coated with an insulating layer.

A thickness of the base body 200A can be appropriately selected. The base body 200A may be either a rigid substrate or a flexible substrate that can be manufactured by a roll-to-roll method. The rigid substrate may be a bendable thin rigid substrate. A material of the conductive wiring line 200B is not particularly limited as long as it is a conductive member, and a material commonly used as a wiring layer of a circuit board or the like can be used.

The covering member 210 is preferably made of an insulating material. Examples of the material of the covering member 210 include the same materials as those exemplified as the material of the base body 200A. By using, as the covering member 210, those in which a white light reflective filler or a large number of air bubbles are contained in the above-mentioned resins, light emitted from the light-emitting device 100D is reflected, so that the light extraction efficiency of the planar light source 1000 can be improved.

Partition Member 300

The partition member 300 is a member that defines a partitioned region 330 to be described below. One partitioned region 330 can be used as a unit for local dimming driving, for example. The partition member 300 includes a plurality of first partition wall portions 310 and a plurality of second partition wall portions 320. The first partition wall portion 310 includes a first ridge line 311 extending in a first direction, a first partition lateral wall 311A, and a second partition lateral wall 311B. In FIG. 21, the first direction is assumed to be the Y direction. The first partition lateral wall 311A and the second partition lateral wall 311B are disposed across the first ridge line 311 in the plan view. An upper end of the first partition lateral wall 311A is continuous with an upper end of the second partition lateral wall 311B. As illustrated in FIG. 22, a space is present between the first partition lateral wall 311A and the second partition lateral wall 311B.

The first ridge line 311 is a line that connects the highest positions of the first partition wall portions 310. The vicinity of the first ridge line 311 may have a pointed shape or a rounded shape in the cross-sectional view taken in a direction orthogonal to the first ridge line 311. The vicinity of the first ridge line 311 may also have a shape in which a flat portion having a very narrow width extends linearly.

The second partition wall portion 320 includes a second ridge line 321 extending in a second direction intersecting the first direction, a third partition lateral wall 321A, and a fourth partition lateral wall 321B. In FIG. 21, the second direction is assumed to be the X direction. However, the first direction and the second direction may not be orthogonal to each other. The third partition lateral wall 321A and the fourth partition lateral wall 321B are disposed across the second ridge line 321 in the plan view. An upper end of the third partition lateral wall 321A is continuous with an upper end of the fourth partition lateral wall 321B. A space is present between the third partition lateral wall 321A and the fourth partition lateral wall 321B.

The second ridge line 321 is a line that connects the highest positions of the second partition wall portions 320. The vicinity of the second ridge line 321 may have a pointed shape or a rounded shape in the cross-sectional view taken in a direction orthogonal to the second ridge line 321. The vicinity of the second ridge line 321 may also have a shape in which a flat portion having a very narrow width extends linearly.

The partitioned region 330 is a region surrounded by the first ridge lines 311 and the second ridge lines 321 in the plan view. A plurality of the partitioned regions 330 are disposed in the first direction and the second direction. In FIG. 21, the plurality of partitioned regions 330 are disposed in a matrix with the first direction (the Y direction) as a row direction and the second direction (the X direction) as a column direction. Each of the plurality of light-emitting devices 100D is disposed in a corresponding one of the partitioned regions 330. Preferably, the light-emitting devices 100D disposed in the corresponding partitioned regions 330 can be independently driven. By so doing, one partitioned region 330 can be used as a unit for local dimming driving.

The partition member 300 may include a plurality of partition bottom portions 340. An outer edge of the partition bottom portion 340 is connected to lower ends of the first partition lateral wall 311A, the second partition lateral wall 311B, the third partition lateral wall 321A, and the fourth partition lateral wall 321B. That is, the first partition lateral wall 311A, the second partition lateral wall 311B, the third partition lateral wall 321A, and the fourth partition lateral wall 321B surrounds the partition bottom portion 340 in the plan view. The first partition lateral wall 311A, the second partition lateral wall 311B, the third partition lateral wall 321A, and the fourth partition lateral wall 321B are inclined with respect to the partition bottom portion 340.

As illustrated in FIG. 21, the partition bottom portion 340 has an opening 340H. The opening 340H is a region in which the light-emitting device can be disposed. The opening portion 340H is disposed, for example, in the center of the partition bottom portion 340 and does not reach the lower ends of the first partition lateral wall 311A, the second partition lateral wall 311B, the third partition lateral wall 321A, and the fourth partition lateral wall 321B. The opening 340H has, for example, a circular shape in the plan view. The opening 340H may be, for example, a polygon such as a triangle, a rectangle, a hexagon, or an octagon.

As illustrated in FIG. 22, the partition member 300 can be fixed on the substrate 200 by using an adhesive member 400. The adhesive member 400 may be, for example, a double-sided tape in which an acrylic resin-based adhesive is applied to both sides of a PET substrate, a hot-melt adhesive sheet, or a resin-based adhesive such as a thermosetting resin or a thermoplastic resin. These adhesive members preferably have high flame resistance.

The partition member 300 preferably has light reflectivity. Thus, light from the light-emitting device 100D can be efficiently reflected upward by the first partition lateral wall 311A, the second partition lateral wall 311B, the third partition lateral wall 321A, the fourth partition lateral wall 321B, and the partition bottom portion 340.

The partition member 300 may be formed by using a resin or the like containing a light reflective material such as titanium oxide, aluminum oxide, or silicon oxide, or may be formed by using a resin containing no light reflective material and then a member having light reflectivity may be provided on the surface thereof. Alternatively, a resin containing a plurality of fine bubbles may be used. In this case, light is reflected at an interface between the bubble and the resin. Examples of the resin used for the partition member 300 include a thermoplastic resin such as an acrylic resin, a polycarbonate resin, a cyclic polyolefin resin, polyethylene terephthalate, polyethylene naphthalate, or polyester, and a thermosetting resin such as an epoxy resin or a silicone resin. The partition member 300 preferably has a reflectance of 70% or more with respect to the peak wavelength of light from the light-emitting device 100D.

The partition member 300 may be formed by a method such as molding by using a mold or molding by optical shaping, or the partition member 300 including each first partition wall portion 310, each second partition wall portion 320, and each partition bottom portion 340 may be prepared by purchase. As a molding method by using a mold, molding methods such as injection molding, extrusion molding, compression molding, vacuum molding, and press molding can be applied. For example, the partition member 300 in which each first partition wall portion 310, each second partition wall portion 320, and each partition bottom portion 340 are integrally formed can be obtained by vacuum forming by using a reflective sheet made of PET or the like.

As illustrated in FIG. 21, the plurality of light-emitting devices 100D include a first light-emitting device 101D and a second light-emitting device 102D. The plurality of light-emitting devices 100D may further include a third light-emitting device 103D and a fourth light-emitting device 104D. The first light-emitting device 101D and the second light-emitting device 102D are disposed side by side in the second direction. The third light-emitting device 103D and the fourth light-emitting device 104D are disposed side by side in the second direction. The first light-emitting device 101D and the third light-emitting device 103D are disposed side by side in the first direction. The second light-emitting device 102D and the fourth light-emitting device 104D are disposed side by side in the first direction.

As illustrated in FIG. 21, the first partition wall portion 310 is located between the first light-emitting device 101D and the second light-emitting device 102D in the plan view. In the plan view, the first partition lateral wall 311A of the first partition wall portion 310 is located between the first light-emitting device 101D and the first ridge line 311. In the plan view, the second partition lateral wall 311B of the first partition wall portion 310 is located between the second light-emitting device 102D and the first ridge line 311.

As illustrated in FIG. 22, the first partition lateral wall 311A is inclined at an inclination angle $\alpha$ ($0° < \alpha < 90°$) with respect to a lower surface of the substrate 200. When the length in the second direction from the center of the first light-emitting device 101D to the center of the second light-emitting device 102D is set as W1 and the length of the first partition wall portion 310 in the third direction (the Z direction) orthogonal to the first direction and the second direction is set as W2, the inclination angle $\alpha$ is preferably $2\times\arctan(2\times W2/W1) < \alpha < 3\times\arctan(2\times W2/W1)$. When the inclination angle $\alpha$ is greater than $2\times\arctan(2\times W2/W1)$, the size of the first partition lateral wall 311A in the second direction is easily reduced. This facilitates design such as shortening the length W1 from the center of the first light-emitting device 101D to the center of the second light-emitting device 102D. When the inclination angle $\alpha$ is smaller than $3\times\arctan(2\times W2/W1)$, light traveling in the lateral direction from the first light-emitting device 101D is easily reflected upward by the first partition lateral wall 311A. This improves the light extraction efficiency of the planar light source 1000.

In the present description, as illustrated in FIG. 22, in the cross-sectional view, the inclination angle $\alpha$ of the first partition lateral wall 311A refers to an angle formed by the lower surface of the substrate 200 and a virtual straight line that connects a point located on the first ridge line 311 and a point P1 located on the first partition lateral wall 311A and located at a position in which the length of the first partition wall portion 310 is half in the third direction. In the present description, the center of the light-emitting device means the geometric centroid of the light-emitting device.

The length W1 in the second direction from the center of the first light-emitting device 101D to the center of the second light-emitting device 102D is preferably in a range from 8 mm to 18 mm. When the length W1 in the second direction from the center of the first light-emitting device 101D to the center of the second light-emitting device 102D is 8 mm or more, the number of light-emitting devices included in the planar light source can be reduced. This can suppress the cost of the planar light source. When the length W1 in the second direction from the center of the first light-emitting device 101D to the center of the second light-emitting device 102D is 18 mm or less, an area of the partitioned region 330 can be reduced. Thus, local dimming can be performed in a small partitioned region.

The length W2 of the first partition wall portion 310 in the third direction is preferably in a range from 0.2 times to 0.3 times the length W1 in the second direction from the center of the first light-emitting device 101D to the center of the second light-emitting device 102D. When the length W2 of the first partition wall portion 310 in the third direction is 0.2 times or more the length W1 in the second direction from the center of the first light-emitting device 101D to the center of the second light-emitting device 102D, light from the first light-emitting device 101D is easily reflected by the first partition wall portion 310. Thus, when the first light-emitting device 101D is turned on and the second light-emitting device 102D is turned off, a contrast ratio between a partitioned region including the first light-emitting device 101D and a partitioned region including the second light-emitting device 102D is easily improved. When the length W2 of the first partition wall portion 310 in the third direction is 0.3 times or less the length W1 in the second direction from the center of the first light-emitting device 101D to the center of the second light-emitting device 102D, the planar light source 1000 in the third direction can be reduced in size.

Figure 23:
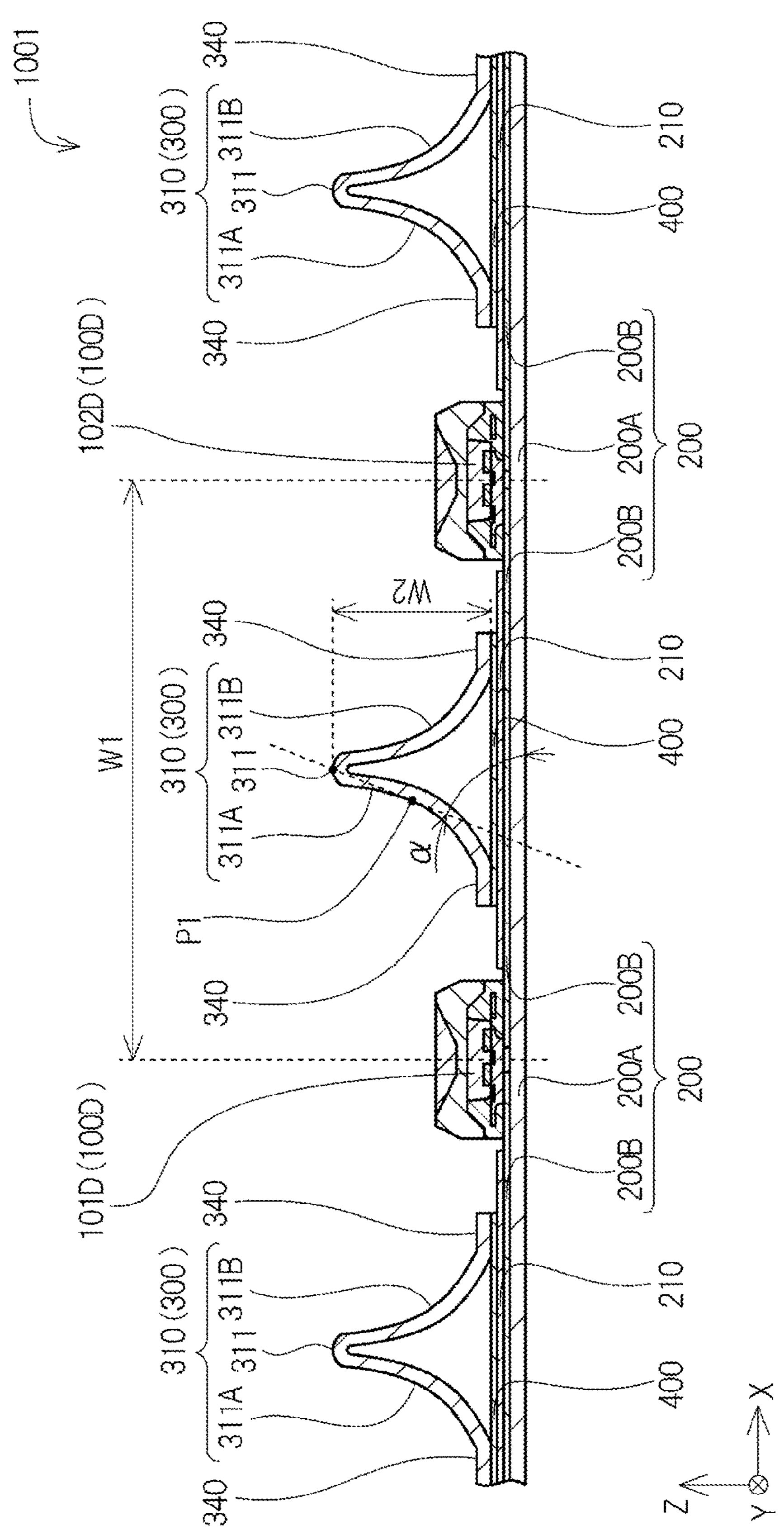
FIG. 23 is a schematic cross-sectional view illustrating a variation of a planar light source according to the present embodiment.

As illustrated in FIG. 22, the surface of the first partition lateral wall 311A and/or the second partition lateral wall 311B may be flat, or as in a planar light source 1001 illustrated in FIG. 23, the surface of the first partition lateral wall 311A and/or the second partition lateral wall 311B may be curved. By changing the shape of the first partition lateral wall 311A and/or the second partition lateral wall 311B, the luminance unevenness of the planar light source is easily controlled.

The first partition lateral wall 311A and the second partition lateral wall 311B are preferably bilaterally symmetrical with respect to a virtual straight line passing through the first ridge line 311 and parallel to the third direction (the Z direction). This makes it easier to suppress luminance unevenness in each partitioned region. In the present description, the "bilateral symmetry" is assumed to allow variations in shape within ±3%.

The planar light source 1000 may include a third light-transmissive member that covers the first light-emitting device 101D and the substrate 200. When the planar light source 1000 includes the third light-transmissive member, the light distribution characteristics of the first light-emitting device 101D are easily controlled, so that the luminance unevenness of the planar light source can be suppressed. The third light-transmissive member may also cover the partition member 300. As a material of the third light-transmissive member, for example, the same material as that of the first light-transmissive member 30 can be used.

Figure 24:
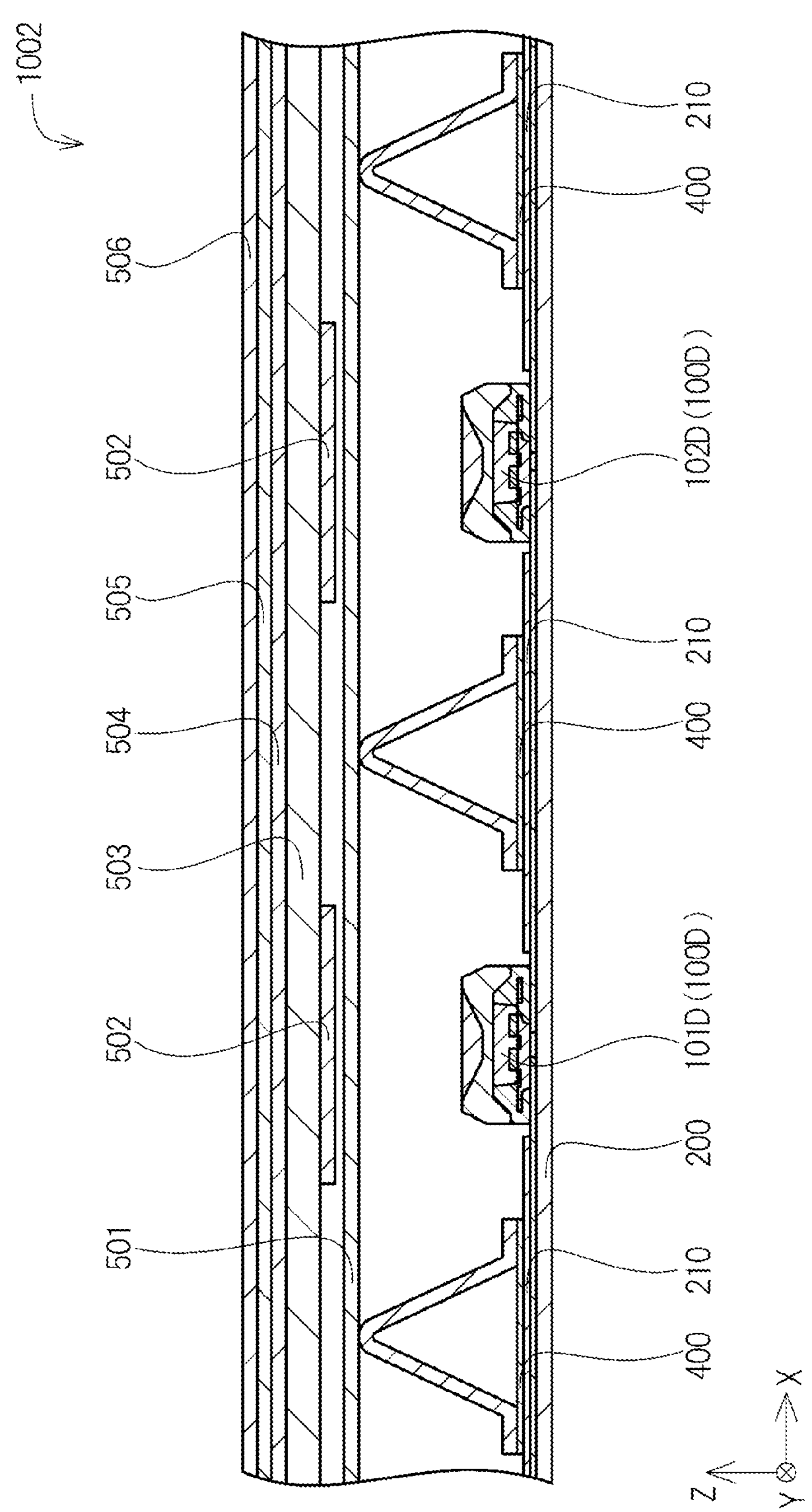
FIG. 24 is a schematic cross-sectional view illustrating another variation of a planar light source according to the present embodiment.

A planar light source 1002 illustrated in FIG. 24 includes a half mirror 501 disposed above the light-emitting device 100D. The half mirror 501 transmits a part of light from the light-emitting device 100D and reflects a part of the light from the light-emitting device 100D toward the substrate 200. The reflectance of the half mirror 501 is preferably designed to be lower in an oblique incidence than in a vertical incidence. That is, the half mirror preferably has a characteristic in which the reflectance is high with respect to light emitted in parallel to an optical axis direction among light emitted from each light-emitting device and the reflectance is reduced as an emission angle increases (when the emission angle is parallel to the optical axis direction, the emission angle is assumed to be 0°). This makes it easier to suppress luminance unevenness of the planar light source. For example, a dielectric multilayer film can be used for the half mirror. By using a dielectric multilayer film, a reflective film with less light absorption can be obtained. Through holes may be provided in the half mirror. The luminance of the planar light source is easily controlled by the sizes, the number, and positions of through holes provided in the half mirror.

The planar light source 1002 illustrated in FIG. 24 includes a reflective member 502 disposed above the half mirror 501. By disposing the reflective member 502 at a position in which the luminance is high, the luminance unevenness of the planar light source is easily suppressed. In the planar light source 1002, the reflective member 502 is disposed above each light-emitting device 100D and at a position overlapping each light-emitting device 100D in the plan view. For example, a resin material containing a light reflective material can be used as a material of the reflective member 502. The same resin material as that of the first light-transmissive member 30 can be used as the resin material of the reflective member 502. The same light reflective material as that of the first light-transmissive member 30 can be used as the light reflective material of the reflective member 502.

The planar light source 1002 illustrated in FIG. 24 includes a light diffusion plate 503 disposed above the reflective member 502. The light diffusion plate 503 diffuses incident light. The light diffusion plate 503, for example, is made of a material having low light absorption for visible light, such as a polycarbonate resin, a polystyrene resin, an acrylic resin, or a polyethylene resin. The structure for diffusing light can be provided in the light diffusion plate 503 by, for example, providing irregularities on a surface of the light diffusion plate 503 or dispersing materials having different refractive indexes in the light diffusion plate 503. As the light diffusion plate, a commercially available product such as a light diffusion sheet or a diffuser film may be used.

The planar light source 1002 illustrated in FIG. 24 includes a first prism sheet 504 and a second prism sheet 505 disposed above the light diffusion plate 503. The first prism sheet 504 and the second prism sheet 505 are members that change the traveling direction of light incident in an oblique direction into a vertical direction to improve the luminance at the front. Polyethylene terephthalate or acrylic can be used as materials of the first prism sheet 504 and the second prism sheet 505.

The planar light source 1002 illustrated in FIG. 24 includes a polarizing sheet 506 disposed above the second prism sheet 505. The polarizing sheet 506 is a member that aligns the polarization direction of emitted light by reflecting an S wave of incident light and transmitting a P wave thereof. Particularly, when the planar light source 1002 is used as a backlight for a liquid crystal panel, the planar light source 1002 preferably includes the polarizing sheet 506.

The planar light source 1002 need not include all of the half mirror 501, the reflective member 502, the light diffusion plate 503, the first prism sheet 504, the second prism sheet 505, and the polarizing sheet 506. That is, the planar light source 1002 may include a part of the half mirror 501, the reflective member 502, the light diffusion plate 503, the first prism sheet 504, the second prism sheet 505, and the polarizing sheet 506. For example, the planar light source 1002 need not include the half mirror 501 and may include the reflective member 502, the light diffusion plate 503, the first prism sheet 504, the second prism sheet 505, and the polarizing sheet 506.

The embodiments of the present invention have been described above with reference to specific examples. However, the present invention is not limited to these specific examples. All aspects that can be practiced by a person skilled in the art changing the design as appropriate based on the above-described embodiments of the present invention are also included in the scope of the present invention, as long as they encompass the spirit of the present invention. In addition, in the spirit of the present invention, a person skilled in the art can conceive of various variations and modifications, and those variations and modifications will also fall within the scope of the present invention.

INDUSTRIAL APPLICABILITY

A light-emitting device according to an embodiment of the present invention can be used in various light sources such as a backlight light source for a liquid crystal, a light source for illumination, an in-vehicle light source, and a light source for display.

REFERENCE SIGNS LIST

10 Support
11 Base portion
12 Wall portion
13 Resin member
14A First lead
14B Second lead
20 Light-emitting element
30 First light-transmissive member
31 First outer surface
32 Second outer surface
33 Third outer surface
40 Light-shielding member
50 Second light-transmissive member
60 Wire
100, 100A to 100H Light-emitting device
200 Substrate
300 Partition member
400 Adhesive member
1000, 1001, 1002 Planar light source

The invention claimed is:

1. A planar light source comprising:
a plurality of light-emitting devices, each comprising:
a support comprising a base portion, and a wall portion,
a light-emitting element located on the base portion of the support and surrounded by the wall portion in a plan view,
a first light-transmissive member having a first outer surface and a second outer surface and covering the light-emitting element and the wall portion, the second outer surface located above the first outer surface and located inside the first outer surface in the plan view, and
a light-shielding member covering the first light-transmissive member, wherein:
the first outer surface and the second outer surface are exposed from the light-shielding member, and
a surface roughness of the first outer surface is greater than a surface roughness of the second outer surface;
a substrate where the plurality of the light-emitting devices are disposed; and
at least one partition member disposed on the substrate, wherein:
the at least one partition member comprises:
a plurality of first partition wall portions, each comprising a first ridge line extending in a first direction; and
a plurality of second partition wall portions, each comprising a second ridge line extending in a second direction intersecting the first direction,
in a plan view, a plurality of partitioned regions, each surrounded by the first ridge line and the second ridge line, are disposed in the first direction and the second direction,
each of the plurality of the light-emitting devices is disposed in a corresponding one of the plurality of partitioned regions,
the plurality of the light-emitting devices comprise a first light-emitting device and a second light-emitting device disposed side by side in the second direction,
the first partition wall portion comprises a first partition lateral wall and a second partition lateral wall disposed across the first ridge line,
in the plan view, the first partition lateral wall is located between the first light-emitting device and the first ridge line,
the first partition lateral wall is inclined at an inclination angle α greater than 0° and less than 90° with respect to a lower surface of the substrate, and
when a length in the second direction from a center of the first light-emitting device to a center of the second light-emitting device is set as W1 and a length of the first partition wall portion in a third direction orthogonal to the first direction and the second direction is set as W2, the inclination angle α satisfies a relationship of $2\times\arctan(2\times W2/W1)<\alpha<3\times\arctan(2\times W2/W1)$.

2. The planar light source according to claim 1, wherein, in each of the plurality of light-emitting devices, an arithmetic average roughness of the first outer surface is in a range from 1.2 times to 5 times an arithmetic average roughness of the second outer surface.

3. The planar light source according to claim 1, wherein, in each of the plurality of light-emitting devices, the arithmetic average roughness of the first outer surface is in a range from 100 nm to 500 nm.

4. The planar light source according to claim 1, wherein, in each of the plurality of light-emitting devices, the arithmetic average roughness of the second outer surface is in a range from 50 nm to 200 nm.

5. The planar light source according to claim 1, wherein, in each of the plurality of light-emitting devices, in a cross-sectional view, an upper surface of the wall portion has an inclined surface inclined downwardly toward an outside.

6. The planar light source according to claim 1, wherein, in each of the plurality of light-emitting devices, a first angle formed by the first outer surface and a lower surface of the support is less than a second angle formed by the second outer surface and the lower surface of the support.

7. The planar light source according to claim 1, wherein, in each of the plurality of light-emitting devices, the first outer surface and an outer surface of the wall portion are flush with each other.

8. The light-emitting device planar light source according to claim 1, wherein, in each of the plurality of light-emitting devices:
an upper surface of the first light-transmissive member defines a recess, and
the light-shielding member is disposed in the recess.

9. The light-emitting device planar light source according to claim 1, wherein, in each of the plurality of light-emitting devices, in the cross-sectional view, the light-shielding member has a first side inclined outwardly toward a top.

10. The planar light source according to claim 9, wherein each of the plurality of light-emitting devices further comprises:
a second light-transmissive member surrounded by the wall portion and covering the light-emitting element, wherein:
in the cross-sectional view, the light-shielding member has a second side and a third side, the second side facing the light-emitting element, the third side located opposite to the second side, and
in the cross-sectional view, a length of the second light-transmissive member in a lateral direction is greater than a length of the second side in the lateral direction and is less than a length of the third side in the lateral direction.

11. The planar light source according to claim 10, wherein, in each of the plurality of light-emitting devices, in the plan view, the second light-transmissive member overlaps an entirety of the light-shielding member.

12. The planar light source according claim 1, wherein, in each of the plurality of light-emitting devices, in the plan view, the light-emitting element overlaps an entirety of the light-shielding member.

13. The planar light source according to claim 1, wherein the length in the second direction from the center of the first light-emitting device to the center of the second light-emitting device is in a range from 8 mm to 18 mm.

14. The planar light source according to claim 1, wherein a length of the first partition wall portion in the third direction is in a range from 0.2 times to 0.3 times the length in the second direction from the center of the first light-emitting device to the center of the second light-emitting device.

15. A planar light source comprising:

a plurality of light-emitting devices, each comprising:

a support comprising a base portion and a wall portion;

a light-emitting element located on the base portion of the support and surrounded by the wall portion in a plan view;

a first light-transmissive member having a first outer surface and a second outer surface and covering the light-emitting element and the wall portion, the second outer surface located above the first outer surface and located inside the first outer surface in the plan view, and a light-shielding member covering the first light-transmissive member, wherein:

in a cross-sectional view, an upper surface of the wall portion has an inclined surface inclined downwardly toward an outside a substrate where the plurality of the light-emitting devices are disposed; and at least one partition member disposed on the substrate, wherein:

the at least one partition member comprises:

a plurality of first partition wall portions, each comprising a first ridge line extending in a first direction; and a plurality of second partition wall portions, each comprising a second ridge line extending in a second direction intersecting the first direction, in a plan view, a plurality of partitioned regions, each surrounded by the first ridge line and the second ridge line, are disposed in the first direction and the second direction, each of the plurality of the light-emitting devices is disposed in a corresponding one of the plurality of partitioned regions, the plurality of the light-emitting devices comprise a first light-emitting device and a second light-emitting device disposed side by side in the second direction, the first partition wall portion comprises a first partition lateral wall and a second partition lateral wall disposed across the first ridge line, in the plan view, the first partition lateral wall is located between the first light-emitting device and the first ridge line, the first partition lateral wall is inclined at an inclination angle $\alpha$ greater than 0° and less than 90° with respect to a lower surface of the substrate, and when a length in the second direction from a center of the first light-emitting device to a center of the second light-emitting device is set as W1 and a length of the first partition wall portion in a third direction orthogonal to the first direction and the second direction is set as W2, the inclination angle $\alpha$ satisfies a relationship of $2\times\arctan(2\times W2/W1)<\alpha<3\times\arctan(2\times W2/W1)$.

16. The planar light source according to claim 15, wherein, in each of the plurality of light-emitting devices, a first angle formed by the first outer surface and a lower surface of the support is less than a second angle formed by the second outer surface and the lower surface of the support.

17. The planar light source according to claim 15, wherein, in each of the plurality of light-emitting devices, the first outer surface and an outer surface of the wall portion are flush with each other.

* * * * *